United States Patent
Toriumi et al.

(10) Patent No.: US 9,722,026 B2
(45) Date of Patent: Aug. 1, 2017

(54) SEMICONDUCTOR STRUCTURE IN WHICH FILM INCLUDING GERMANIUM OXIDE IS PROVIDED ON GERMANIUM LAYER, AND METHOD FOR MANUFACTURING SEMICONDUCTOR STRUCTURE

(71) Applicant: JAPAN SCIENCE AND TECHNOLOGY AGENCY, Kawaguchi-shi, Saitama (JP)

(72) Inventors: Akira Toriumi, Tokyo (JP); Toshiyuki Tabata, Tokyo (JP); Choong Hyun Lee, Tokyo (JP); Tomonori Nishimura, Tokyo (JP); Cimang Lu, Tokyo (JP)

(73) Assignee: JAPAN SCIENCE AND TECHNOLOGY AGENCY, Kawaguchi-Shi (JP)

( * ) Notice: Subject to any disclaimer, the term of this patent is extended or adjusted under 35 U.S.C. 154(b) by 0 days.

(21) Appl. No.: 14/914,310

(22) PCT Filed: Jun. 6, 2014

(86) PCT No.: PCT/JP2014/065144
§ 371 (c)(1),
(2) Date: Feb. 25, 2016

(87) PCT Pub. No.: WO2015/029535
PCT Pub. Date: Mar. 5, 2015

(65) Prior Publication Data
US 2016/0218182 A1 Jul. 28, 2016

(30) Foreign Application Priority Data

Aug. 30, 2013 (JP) .................................. 2013-179912
Sep. 20, 2013 (JP) .................................. 2013-195887

(51) Int. Cl.
H01L 21/16 (2006.01)
H01L 21/02 (2006.01)
(Continued)

(52) U.S. Cl.
CPC ........ *H01L 29/16* (2013.01); *H01L 21/02112* (2013.01); *H01L 21/02266* (2013.01);
(Continued)

(58) Field of Classification Search
CPC ..................................................... H01L 29/517
See application file for complete search history.

(56) References Cited

U.S. PATENT DOCUMENTS 7,842,612 B2 * 11/2010 Nemouchi ........ H01L 21/28097
257/E21.44
2005/0106893 A1 * 5/2005 Wilk ................... C23C 16/0245
438/758
(Continued)

FOREIGN PATENT DOCUMENTS

WO 2006/025350 A1 3/2006

OTHER PUBLICATIONS

Oshima et. al., "Chemical Bonding, Interfaces and Defects in Hafnium Oxide/Germanium Oxynitride Gate Stacks on Ge (100)"; Journal of Electrochemical Society, Oct. 2008, pp. 1-22.*
(Continued)

*Primary Examiner* — Jarrett Stark
*Assistant Examiner* — Charles N Ausar-El

(57) ABSTRACT

A semiconductor structure includes: a germanium layer; and a first insulating film that is formed on an upper surface of the germanium layer, primarily contains germanium oxide and a substance having an oxygen potential lower than an oxygen potential of germanium oxide, and has a physical film thickness of 3 nm or less; wherein a half width of
(Continued)

frequency to height in a 1 μm square area of the upper surface of the germanium layer is 0.7 nm or less.

13 Claims, 37 Drawing Sheets

(51) Int. Cl.

| | |
|---|---|
| *H01L 21/28* | (2006.01) |
| *H01L 21/324* | (2006.01) |
| *H01L 29/51* | (2006.01) |
| *H01L 29/66* | (2006.01) |
| *H01L 29/78* | (2006.01) |
| *H01L 29/16* | (2006.01) |
| *C23C 14/08* | (2006.01) |
| *C23C 14/35* | (2006.01) |

(52) U.S. Cl.
CPC .... *H01L 21/28255* (2013.01); *H01L 21/3247* (2013.01); *H01L 29/517* (2013.01); *H01L 29/66477* (2013.01); *H01L 29/78* (2013.01); *C23C 14/083* (2013.01); *C23C 14/086* (2013.01); *C23C 14/352* (2013.01)

(56) References Cited

U.S. PATENT DOCUMENTS

| | | | | |
|---|---|---|---|---|
| 2010/0019357 | A1* | 1/2010 | Toriumi | H01L 21/28185 257/635 |
| 2011/0256730 | A1* | 10/2011 | Riou | H01L 21/302 438/759 |
| 2012/0160663 | A1* | 6/2012 | Gillaspie | C23C 14/0057 204/192.15 |
| 2013/0069126 | A1* | 3/2013 | Huang | H01L 29/41783 257/288 |
| 2013/0109199 | A1* | 5/2013 | Vellianitis | H01L 29/66795 438/785 |
| 2013/0248881 | A1* | 9/2013 | Ariyoshi | H01L 29/1608 257/77 |
| 2013/0292748 | A1* | 11/2013 | Okazaki | H01L 21/28097 257/288 |
| 2013/0292778 | A1* | 11/2013 | Cartier | H01L 21/823857 257/369 |
| 2013/0344248 | A1* | 12/2013 | Clark | C23C 16/34 427/255.393 |
| 2014/0117465 | A1* | 5/2014 | Huang | H01L 29/78 257/411 |
| 2014/0145312 | A1* | 5/2014 | Wang | H01L 29/02 257/632 |
| 2014/0210835 | A1* | 7/2014 | Hong | H01L 29/78696 345/530 |

OTHER PUBLICATIONS

J. Kishiwada et al., "Low Temperature Fabrication of AlN/Ge Structure Using Electron Cyclotron Resonance Plasma Nitridation", ECS Transactions, vol. 25, No. 6, pp. 301-306 (2009).
Masahiro Kudo et al., "Fabrication and Analysis of AlN/GaAs(001) and AlN/Ge/GaAs(001) Metal-Insulator-Semiconductor Structures", Japanese Journal of Applied Physics, vol. 51, pp. 02BF07-1-02BF07-5 (2012).
Koji Kita et al., "Control of high-k/germanium interface properties through selection of high-k materials and suppression of GeO volatilization", Applied Surface Science, vol. 254, pp. 6100-6105 (Jul. 30, 2008), Elsevier B.V.
T. Nishimura et al., "Electron Mobility in High-k Ge-MISFETs Goes Up to Higher", 2010 Symposium on VLSI Technology Digest of Technical Papers, pp. 209-210 (Jun. 17, 2010), IEEE.
International Search Report received for PCT Patent Application No. PCT/JP2014/065144 mailed on Sep. 9, 2014, 3 pages (1 page of English translation of International Search Report, 2 pages of International Search Report).
C. Lu et al., "Influence of Yttrium concentration on the oxidation barrier effect of Y-doped GeO2 interfacial layer", Extended Abstracts of the 74th JSAP Autumn Meeting 2013, p. 13-056.
C.H. Lee et al., "Enhancement of High-Ns Electron Mobility in Sub-nm EOT Ge n-MOSFETs ", 2013 Symposium on VLSI Technology Digest of Technical Papers, pp. T28-T29.
C. Lu et al., "Thermodynamic selection of the desirable doping materials in GeO2", Extended Abstracts of the 61st JSAP Spring Meeting 2014, p. 13-278.
C.H. Lee et al., "Record-high Electron Mobility in Sub-nm EOT Ge n-MOSFETs with Y-doped GeO2 Interfacial Layer", Extended Abstracts of the 61st JSAP Spring Meeting 2014, p. 13-279.
C.H. Lee et al., "Oxygen Potential Engineering of Interfacial Layer for Deep Sub-nm EOT High-k Gate Stacks on Ge", International Electron Devices Meeting 2013 Technical Digest, IEEE , pp. 2.5.1-2.5.4.
C. Lu et al., "Network modification of GeO2 by trivalent metal oxide doping", Extended Abstracts of the 61st JSAP Spring Meeting 2014, [20a-F10-10], p. 13-277.
C.H. Lee et al., "Enhancement of High-Ns Electron Mobility in Sub-nm EOT Ge n-MOSFETs", presentation at 2013 Symposium on VLSI Technology, IEEE, Jun. 11, 2013, Rihga Royal Hotel, Kyoto, Japan.
C. Lu et al., "Influence of Yttrium concentration on the oxidation barrier effect of Y-doped GeO2 interfacial layer", presentation at the 74th JSAP Autumn Meeting and 2013 JSAP-MRS joint Symposia, Sep. 17, 2013, Doshisha University, Kyoto, Japan.
C. Lu et al., "Network modification of GeO2 by trivalent metal oxide doping", presentation at the 61st JSAP Spring Meeting, Mar. 20, 2014, Aoyama Gakuin University, Kanagawa, Japan.
C. Lu et al., "Thermodynamic selection of the desirable doping materials in GeO2", presentation at the 61st JSAP Spring Meeting, Mar. 20, 2014, Aoyama Gakuin University, Kanagawa, Japan.
C.H. Lee et al., "Record-high Electron Mobility in Sub-nm EOT Ge n-MOSFETs with Y-doped GeO2 Interfacial Layer", presentation at the 61st JSAP Spring Meeting, Mar. 20, 2014, Aoyama Gakuin University, Kanagawa, Japan.
C.H. Lee et al., "Oxygen Potential Engineering of Interfacial Layer for Deep Sub-nm EOT High-k Gate Stacks on Ge", presentation at International Electron Devices Meeting, Dec. 9, 2013, Washington Hilton, Washington, DC, U.S.A.
C. Lu et al., "Thermodynamically Controlled GeO2 by Introducing M2O3 for Ultra-Thin EOT Ge Gate Stacks", presentation at 2014 MRS Spring Meeting & Exhibit, Apr. 24, 2014, The Moscone West Convention Center, San Francisco, U.S.A.
International Preliminary Report on Patentability received for PCT Patent Application No. PCT/JP2014/065144, 5 pages (3 pages of English Translation and 2 pages of International Preliminary Report on Patentability).
Written Opinion of the International Searching Authority received for PCT Patent Application No. PCT/JP2014/065144, 5 pages (3 pages of English Translation and 2 pages of Written Opinion of the International Searching Authority).

* cited by examiner

HEAT TREATMENT

SEMICONDUCTOR STRUCTURE IN WHICH FILM INCLUDING GERMANIUM OXIDE IS PROVIDED ON GERMANIUM LAYER, AND METHOD FOR MANUFACTURING SEMICONDUCTOR STRUCTURE

CROSS REFERENCE TO RELATED APPLICATIONS

This patent application is a U.S. national stage application under 35 U.S.C. §371 of International Patent Application No. PCT/JP2014/065144 filed on Jun. 6, 2014, which claims the benefit of foreign priority to Japanese Patent Application No. JP 2013-179912 filed on Aug. 30, 2013, and to Japanese Patent Application No. JP 2013-195887 filed on Sep. 20, 2013. The International Application was published in Japanese on Mar. 5, 2015, as International Publication No. WO 2015/029535 A1 under PCT Article 21(2).

TECHNICAL FIELD

The present invention relates to a semiconductor structure and a method of fabricating the same, and more particularly to a semiconductor structure including a film containing germanium oxide on a germanium layer and a method of fabricating the same.

BACKGROUND ART

Germanium (Ge) is a semiconductor having electronic properties better than those of silicon (Si). There has been known a MOSFET (Metal Oxide Semiconductor Field Effect Transistor) using germanium for a semiconductor layer (for example, Non-Patent Documents 1, 2).

PRIOR ART DOCUMENT

Non-Patent Document

Non-Patent Document 1: ECS Transactions, 25(6) (2009) pp. 301-306
Non-Patent Document 2: Japanese Journal of Applies Physics 51 (2012) 02BF07

SUMMARY OF THE INVENTION

Problem to be Solved by the Invention

For example, when a germanium layer is used to form a MOSFET, the flatness (the surface roughness) of the interface between the germanium layer and a gate insulator is important. When the germanium layer has a surface of low flatness, transistor characteristics deteriorate, or the long-term reliability of the transistor decreases.

The fabrication process after the formation of the insulating film or the like also deteriorates the insulating film and/or the interface between the insulating film and the germanium layer.

The present invention has been made in view of the above problems, and aims to improve the flatness of the upper surface of a germanium layer including an insulating film formed on the upper surface of the germanium layer, or to inhibit the deterioration of the insulating film and/or the deterioration of the interface between the insulating film and the germanium layer.

Means for Solving the Problem

The present invention is a semiconductor structure characterized by including: a germanium layer; and a first insulating film that is formed on an upper surface of the germanium layer and primarily contains germanium oxide and a substance having an oxygen potential lower than an oxygen potential of germanium oxide, wherein a half width of frequency to height in a 1 μm square area of the upper surface of the germanium layer is 0.7 nm or less.

In the above configuration, the substance may primarily contain at least one of germanium nitride, yttrium oxide, scandium oxide, and aluminum oxide.

In the above configuration, the semiconductor structure may further include a metal layer formed on the first insulating film.

In the above configuration, the semiconductor structure may include a second insulating film that is formed between the first insulating film and the metal layer and has a composition different from a composition of the first insulating film.

In the above configuration, the half width may be 0.5 nm or less.

The present invention is a method of fabricating a semiconductor structure, the method characterized by including: forming a first insulating film on a germanium layer, the first insulating film primarily containing germanium oxide and a substance having an oxygen potential lower than an oxygen potential of germanium oxide; heat treating the first insulating film in an oxidizing gas atmosphere at a pressure at which a pressure of gas at room temperature is greater than atmospheric pressure at a heat treatment temperature greater than a temperature at which the first insulating film is formed.

In the above configuration, the substance may primarily contain at least one of germanium nitride, yttrium oxide, scandium oxide, and aluminum oxide.

In the above configuration, the method may further include forming a second insulating film on the first insulating film, the second insulating film having a composition different from a composition of the first insulating film, wherein the heat treating is conducted after the forming of the second insulating film.

In the above configuration, the oxidizing gas atmosphere may be an oxygen gas atmosphere.

In the above configuration, a half width of frequency to height in a 1 μm square area of the upper surface of the germanium layer may be 0.7 nm or less.

In the above configuration, the pressure may be a pressure at which the upper surface of the germanium layer is planarized.

The present invention is a semiconductor structure characterized by including: a germanium layer; and a first insulating film that is formed on an upper surface of the germanium layer and primarily contains germanium oxide and an oxide of at least one of an alkaline-earth element, a rare-earth element, and aluminum.

In the above configuration, the at least one of an alkaline-earth element, a rare-earth element, and aluminum may be at least one of yttrium, scandium, gadolinium, terbium, dysprosium, holmium, erbium, thulium, ytterbium, and lutetium.

In the above configuration, an atomic composition ratio of at least one element of an alkaline-earth element, a rare-earth element, and aluminum to the at least one element and germanium may be 6% or greater and 30% or less.

In the above configuration, the at least one element may be yttrium.

In the above configuration, the semiconductor structure may further include: a second insulating film that is formed on the first insulating film and has a permittivity greater than a permittivity of silicon oxide; and a gate electrode formed on the second insulating film.

In the above configuration, the semiconductor structure may further include: a gate electrode formed on the first insulating film without a second insulating film having a permittivity greater than a permittivity of a silicon oxide film.

Effects of the Invention

The present invention improves the flatness of the upper surface of a germanium layer including an insulating film formed on the upper surface of the germanium layer, or inhibits the deterioration of the insulating film and/or the deterioration of the interface between the insulating film and the germanium layer.

BRIEF DESCRIPTION OF THE DRAWINGS

FIG. 08 is a graph of heat treatment time versus film thickness;

MODES FOR CARRYING OUT THE EMBODIMENTS

To planarize the surface of a silicon layer, there has been a method that oxidizes the surface of the silicon layer, and then removes the oxide film to planarize the surface of the silicon layer. Therefore, a method was studied that oxidizes the surface of a germanium layer, and then removes the oxide film to planarize the surface of the germanium layer. Prepared was a germanium substrate having a (100) plane as a principal plane. The surface of the germanium substrate was treated with high-temperature pure water to intentionally form roughness. Measured was the RMS (Root Mean Square) of the surface of the germanium substrate. The surface of the germanium substrate was thermally oxidized at a temperature of 550° C. for ten minutes by HPO (High Pressure Oxidation). Then, heat treatment was conducted under an oxygen atmosphere at a temperature of 400° C. for 60 minutes by LOA (Low Temperature $O_2$ Annealing). This process formed a germanium oxide film with a film thickness of approximately 15 nm. Then, the germanium oxide film was removed with dilute hydrofluoric acid. The RMS of the surface of the germanium substrate was then measured. The AFM (Atomic Force Microscope) was used to measure the RMS.

Figure 1:
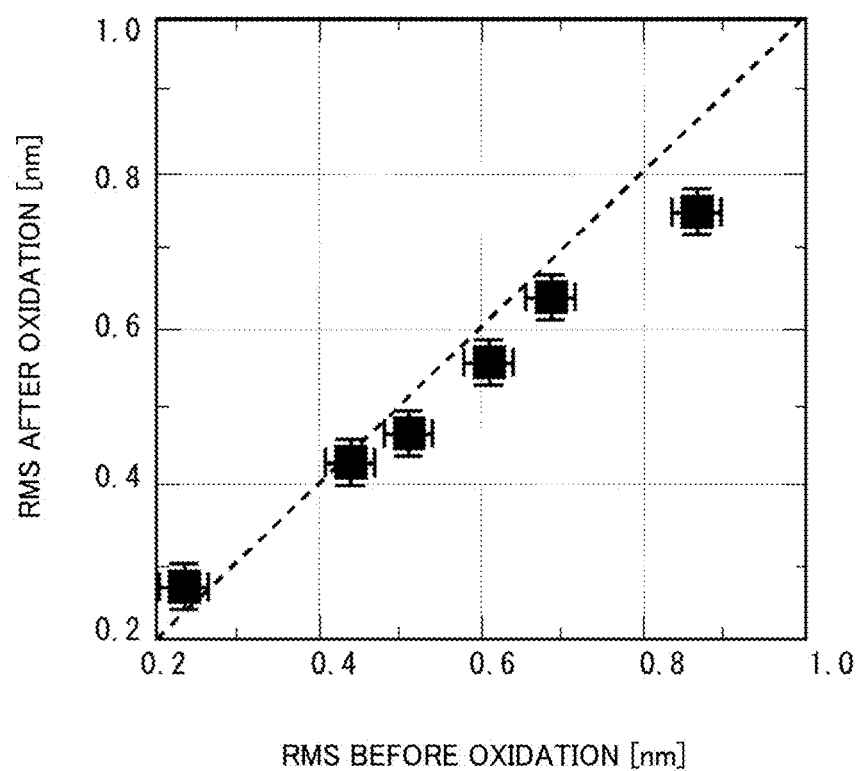
FIG. 1 is a graph of the RMS of a germanium substrate before oxidation versus the RMS after the removal of a germanium oxide film.

FIG. 1 is a graph of the RMS of the germanium substrate having the intentionally-formed roughness before oxidation versus the RMS after the removal of the germanium oxide film (the measurement area is a 2 µm square area). Dots represent measurement points, and horizontal and vertical bars represent the margin of error. As illustrated in FIG. 1, when the surface of the germanium substrate is oxidized and the germanium oxide film is then removed, the flatness of the surface of the germanium substrate fails to improve.

The inventors have found that the surface of the germanium substrate is planarized when the germanium oxide film contains a substance with an oxygen potential less than the oxygen potential of germanium oxide and is heat-treated in an oxidizing gas atmosphere. Hereinafter, a description will be given of embodiments.

First Embodiment

Figure 2A:
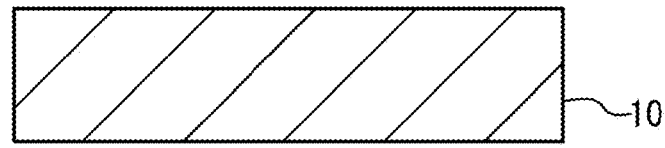
FIG. 2A through FIG. 2D are cross-sectional views illustrating a method of fabricating a semiconductor structure in accordance with a first embodiment.

A first embodiment uses germanium nitride as a substance having a low oxygen potential. FIG. 2A through FIG. 2D are cross-sectional views illustrating a method of fabricating a semiconductor structure in accordance with the first embodiment. As illustrated in FIG. 2A, a germanium substrate 10 is prepared. The germanium substrate 10 has a (100) plane as a principal plane, is doped with Ga (gallium), has a dopant concentration of approximately $1 \times 10^{16}$ cm$^{-3}$, and is p-type. To examine changes in the surface roughness of the germanium substrate 10, the surface of the germanium substrate 10 is treated with hydrogen peroxide solution ($H_2O_2$).

Figure 2B:
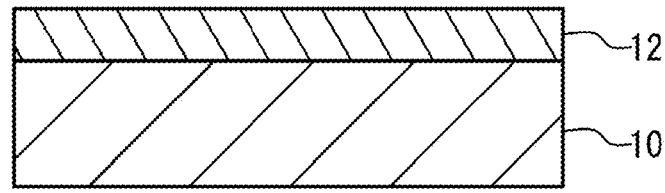

As illustrated in FIG. 2B, a germanium oxynitride film as an insulating film 12 is formed on the germanium substrate 10. The insulating film 12 is formed by reactive sputtering using a target of germanium and using a nitrogen gas and an oxygen gas. Alternatively, the insulating film 12 may be formed by sputtering using a target of germanium dioxide and using a nitrogen gas.

Figure 2C:
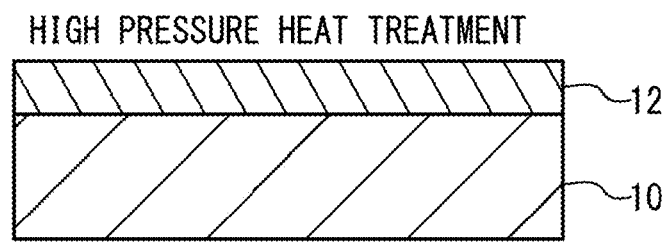
Figure 2D:
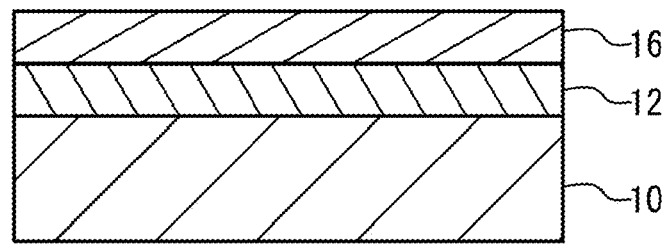

As illustrated in FIG. 2C, the germanium substrate 10 is heat-treated in an oxygen gas atmosphere (gas of 100% oxygen). As illustrated in FIG. 2D, after the heat treatment, a gold (Au) film as a metal film 16 is formed on the surface of the insulating film 12 that is a germanium oxynitride film.

Heat treatment in FIG. 2C was conducted where the insulating film 12 had a film thickness of 6.6 nm and an atomic composition ratio of nitrogen (nitrogen/(oxygen+nitrogen)) of 10 atomic %. The heat treatment was conducted at a heat treatment temperature of 550° C. or 600° C. at an oxygen gas pressure of 1 atm, 10 atm, or 70 atm for five minutes of heat treatment time. The gas pressure is a pressure at room temperature (approximately 25° C.). That is, a sample is sealed under the above gas pressure at room temperature, and is then heat treated with the temperature increased. Thus, the gas pressure during the heat treatment is greater than the above gas pressure. The same applies to the embodiments hereinafter.

For comparison, fabricated was a sample (described as "as-depo") that was not heat treated after a germanium oxynitride film as the insulating film 12 was formed.

After FIG. 2C, the insulating film 12 was removed with water. The surface of each sample was observed by AFM.

Figure 3A:
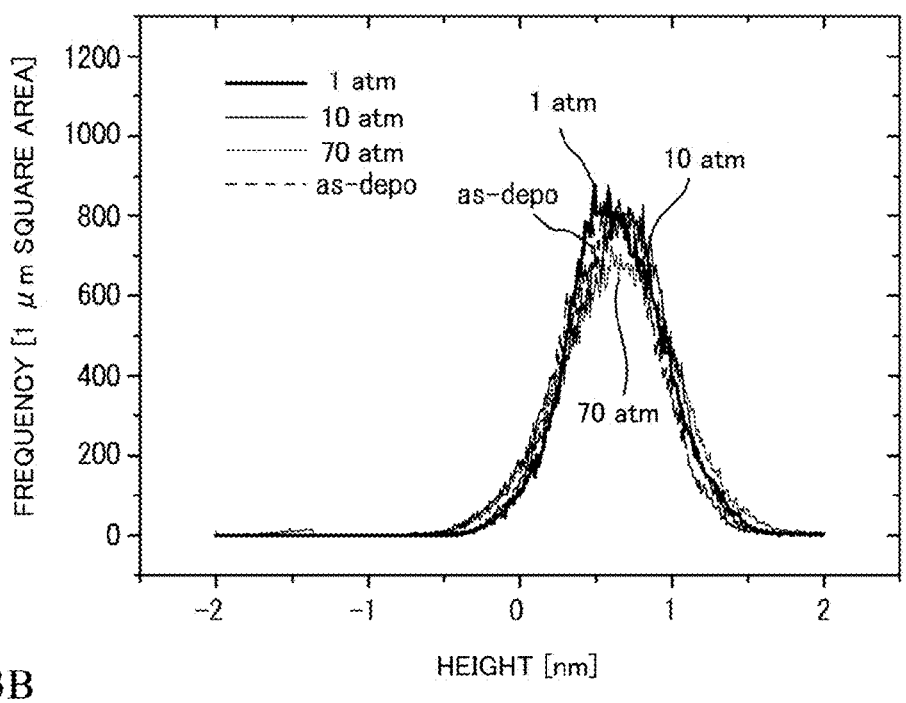
FIG. 3A and FIG. 3B are graphs of height versus frequency with respect to each measurement point within an area of 1 μm×1 μm of the upper surface of the germanium substrate.
Figure 3B:
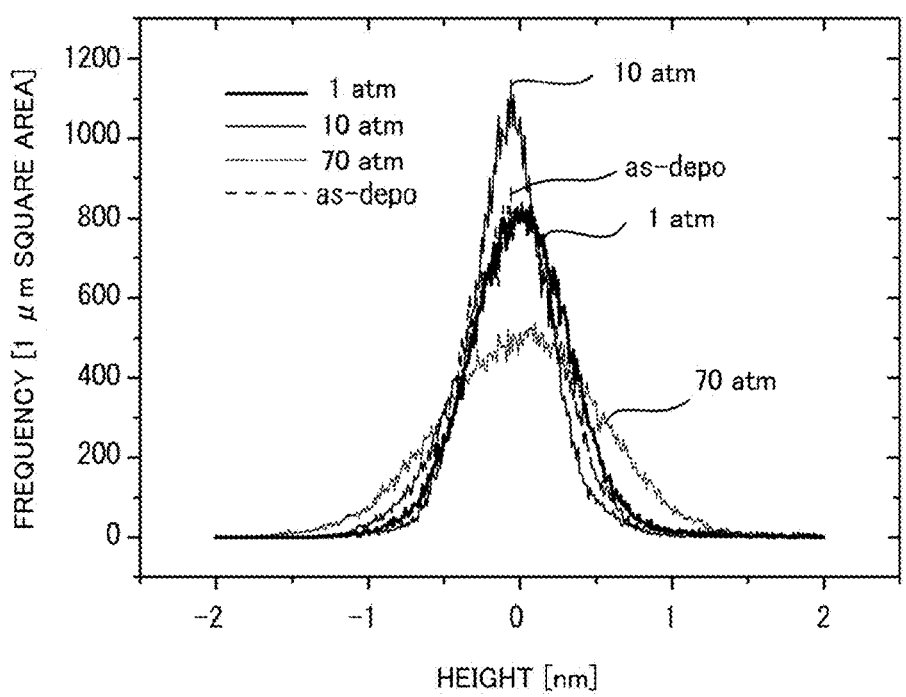

FIG. 3A and FIG. 3B are graphs of height versus frequency with respect to each measurement point within an area of 1 µm×1 µm of the upper surface of the germanium substrate. The height represents the height of the surface of the germanium substrate 10 (a reference height is freely selected). The heat treatment temperature in an oxygen gas atmosphere is 550° C. in FIG. 3A, and is 600° C. in FIG. 3B. In each figure, corresponding frequencies are connected by a straight line. The bold solid line, the solid line, the dotted line, and the dashed line respectively indicate measurement results at a pressure of 1 atm, 10 atm, and 70 atm, and measurement results of as-depo. The half width of the frequency to the height (referred to as a frequency distribution) is as follows. The smaller half width exhibits the better flatness.

| Heat treatment temperature | 550° C. | 600° C. |
|---|---|---|
| Pressure: 1 atm | 0.8 nm | 0.8 nm |
| Pressure: 10 atm | 0.8 nm | 0.5 nm |
| Pressure: 70 atm | 0.8 nm | 1.3 nm |
| as-depo | 0.8 nm | 0.8 nm |

As illustrated in FIG. 3A, the samples heat treated at a heat treatment temperature of 550° C. have frequency distributions approximately the same as the frequency distribution of as-depo regardless of pressure. In contrast, as illustrated in FIG. 3B, the samples heat treated at a heat treatment temperature of 600° C. have different frequency distributions depending on the pressure. At 1 atm, the frequency distribution is close to the same as that of as-depo. At 10 atm, the frequency distribution is steeper than that of as-depo. This demonstrates that the surface of the germanium substrate 10 heat treated at 10 atm is flatter than the surface of the germanium substrate 10 heat treated at 1 atm and the surface of as-depo. At 70 atm, the frequency distribution is gentler than that of as-depo.

Figure 4:
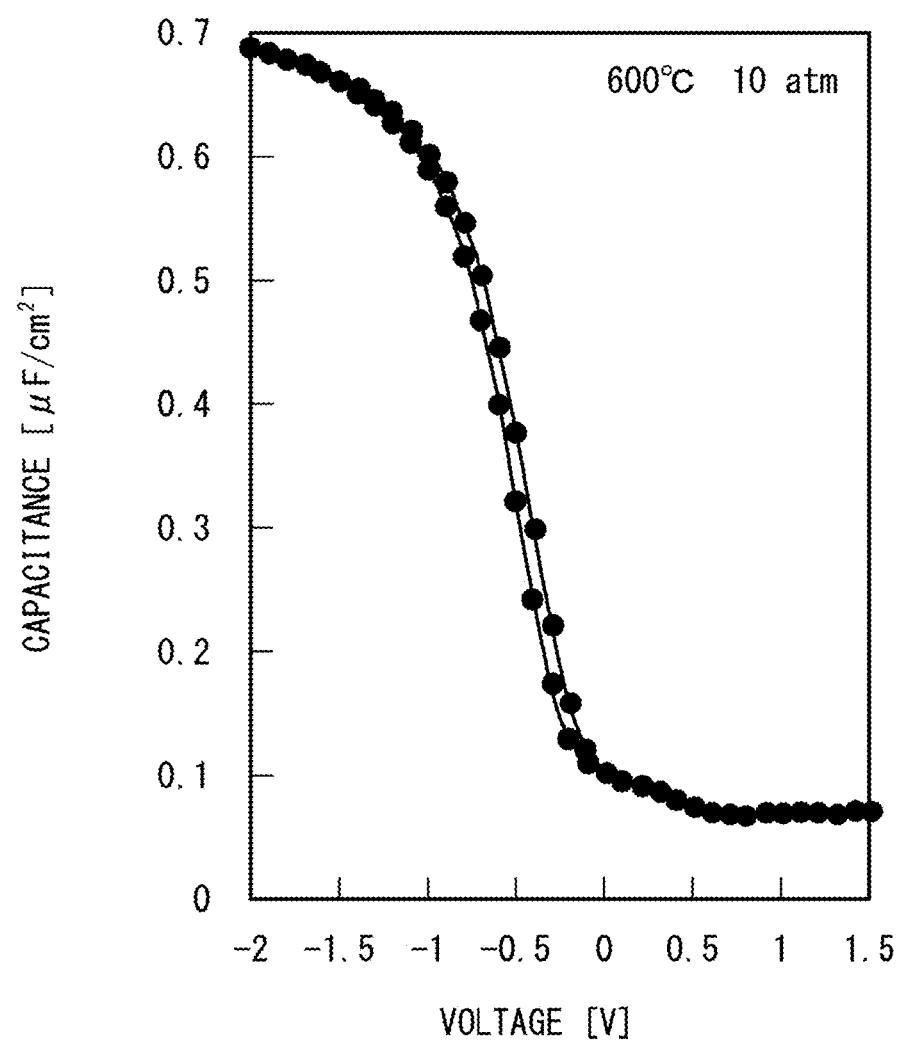
FIG. 4 illustrates C—V characteristics in the first embodiment.

For the sample heat treated at a heat treatment temperature of 600° C. at a pressure of 10 atm, the metal film 16 was formed on the insulating film 12 as illustrated in FIG. 2D, and C—V measurement was conducted at room temperature. FIG. 4 illustrates C—V characteristics in the first embodiment. Dots represent measurement points. The measurement frequency is 1 MHz. As illustrated in FIG. 4, hysteresis is hardly observed, and the capacitance sharply changes between an accumulation state and an inversion state. This reveals that a good MIS (Metal insulator Semiconductor) structure is formed in the sample heat treated at a heat treatment temperature of 600° C. at a pressure of 10 atm.

As described above, when the germanium substrate 10 is heat treated in a high-pressure oxygen gas atmosphere after the formation of a germanium oxynitride film on the germanium substrate 10, the surface of the germanium substrate 10 is planarized. To examine the reason, a germanium oxynitride film and a germanium dioxide ($GeO_2$) film were analyzed in ultra-high vacuum by TDS (Thermal Desorption Spectroscopy).

Figure 5A:
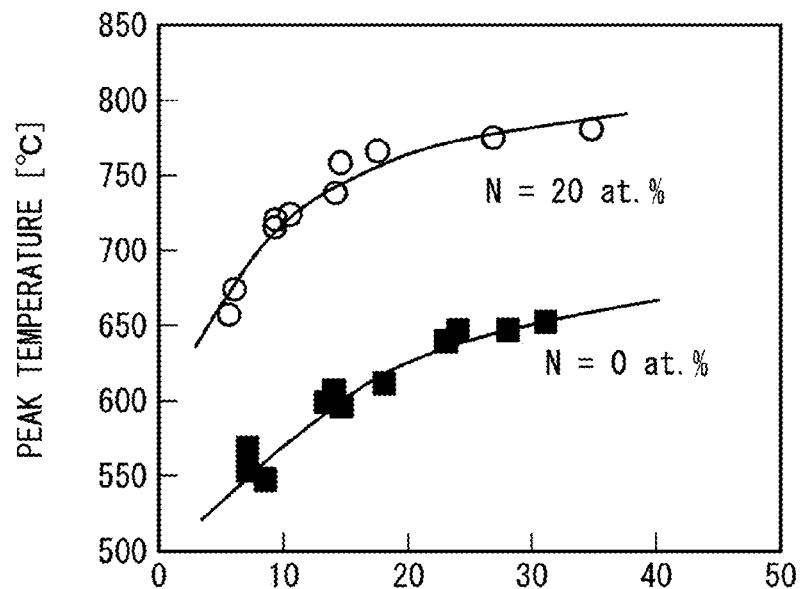
FIG. 5A is a graph of film thickness versus peak temperature at which germanium monoxide is detected in ultra-high vacuum.

FIG. 5A is a graph of film thickness versus peak temperature at which germanium monoxide (M/z=90: GeO) is detected. Square dots represent measurement points of the germanium dioxide film, and open circle dots represent measurement points of the germanium oxynitride film having 20% of an atomic composition ratio of nitrogen. The curves are approximate curves. The rising rate of the temperature is 20° C./min, and the degree of vacuum for measurement is $2 \times 10^{-7}$ Pa.

As illustrated in FIG. 5A, the temperature at which a germanium monoxide gas is released from the germanium oxynitride film on the germanium substrate 10 is 150° C. higher than the temperature at which a germanium monoxide gas is released from the germanium dioxide film on the germanium substrate 10. The above temperature difference also depends on the film thickness of the germanium oxynitride film. This is because since germanium nitride has an oxygen potential (the partial molar Gibbs free energy of oxygen) lower than that of germanium dioxide, germanium nitride inhibits the release of germanium monoxide.

A heat treatment was further conducted in a nitrogen gas atmosphere. The details of the experiment is as follows. First, a germanium oxynitride film as the insulating film 12 was formed. The insulating film 12 had a film thickness of 7.3 nm and an atomic composition ratio of nitrogen (nitrogen/(oxygen+nitrogen)) of 11 atomic %. Then, heat treatment was conducted in a nitrogen gas atmosphere. The heat treatment temperature was 600° C. Then, the insulating film 12 was removed with water. The surface of each sample was observed by AFM.

Figure 5B:
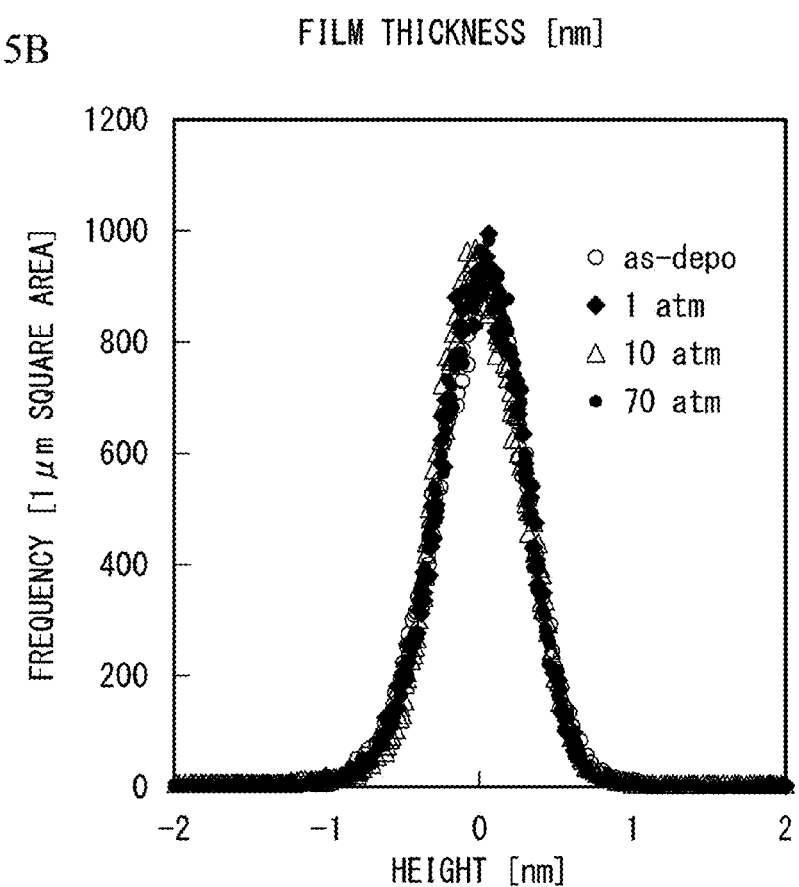
FIG. 5B is a graph of height versus frequency of a sample heat-treated in a nitrogen atmosphere.

FIG. 5B is a graph of height versus frequency with respect to samples heat-treated in a nitrogen atmosphere. In FIG. 5B, square, triangle, black circle, and open circle dots respectively represent measurement results of samples heat treated at a nitrogen gas pressure of 1 atm, 10 atm, and 70 atm, and measurement results of as-depo. As illustrated in FIG. 5B, in any of conditions, the half width of the frequency distribution is greater than 0.7 nm. Despite the heat treatments with nitrogen gas at pressures of 1 atm, 10 atm, and 70 atm, the film thickness of the insulating film 12 failed to change, and failed to be planarized compared to that of as-depo.

In light of these facts, the mechanism of how the surface of the germanium substrate 10 is planarized is considered as follows. When the germanium substrate 10 is heat treated with oxygen with a germanium oxynitride film formed on the germanium substrate 10, the surface of the germanium substrate 10 is hardly oxidized even at a temperature of approximately 600° C. This is considered to be because the oxygen potential of the germanium oxynitride film decreases due to germanium nitride, the diffusion of oxygen is greatly inhibited, and the oxidation of germanium is inhibited. Germanium atoms at the interface between the germanium substrate 10 and the germanium oxynitride film easily move at high temperature. Thus, the germanium atoms move between the germanium substrate 10 and the germanium oxynitride film, and/or the most oxygen reactive part of the surface of the germanium substrate surface combines with trace amounts of oxygen. This planarizes the interface between the germanium substrate 10 and the germanium oxynitride film. The interface is considered to be planarized when the movement of germanium atoms at the interface, the oxidation of germanium on the surface of the germanium substrate 10, and the release rate of a germanium monoxide gas from the germanium oxynitride film become balanced.

As illustrated in FIG. 1, when heat treated is a germanium dioxide film containing no substance having a low oxygen potential, the release rate of germanium monoxide increases and the surface of the germanium substrate 10 is not planarized.

As illustrated in FIG. 3A, when the heat treatment temperature is low, germanium atoms at the interface hardly move, and the surface of the germanium substrate 10 is not planarized.

When the pressure of an oxygen gas is atmospheric pressure such as 1 atm in FIG. 3B, germanium at the interface is hardly oxidized, and the surface of the germanium substrate 10 is not planarized.

When the pressure of an oxygen gas is too high such as 70 atm in FIG. 3B, and the oxidation rate of the interface of the germanium substrate 10 is too fast, planarization of the surface of the germanium substrate 10 is inhibited.

Furthermore, as illustrated in FIG. 5B, even when heat-treated in a gas atmosphere containing no oxygen, the surface of the germanium substrate 10 is not oxidized, and the surface of the germanium substrate 10 is not planarized. This is considered to be because the most oxygen reactive part of the surface of the germanium substrate fails to combine with trace amounts of oxygen even when the germanium substrate is heat-treated in a gas atmosphere containing no oxygen.

As indicated by 10 atm of FIG. 3B, when the interface of the germanium substrate 10 is oxidized under an oxygen gas atmosphere, the oxidation of germanium is inhibited to some extent, and the interface is planarized.

As described above, an insulating film primarily containing germanium oxide and a substance having an oxygen potential lower than the oxygen potential of germanium oxide is formed on the germanium substrate 10. The heat treatment condition for achieving the flatness of the surface of the germanium substrate 10 depends on the type of and the concentration of the substance having a low oxygen potential in the germanium oxide film. The heat treatment is conducted at least in an oxidizing gas atmosphere at a pressure at which the pressure of the gas at room temperature is greater than atmospheric pressure at a heat treatment temperature higher than the temperature at which the insulating film 12 is formed. This improves the flatness of the upper surface of the germanium layer 30.

Second Embodiment

A second embodiment uses yttrium oxide ($Y_2O_1$) as a substance with a low oxygen potential.

The method of fabricating a semiconductor structure in accordance with the second embodiment is the same as that of the first embodiment illustrated in FIG. 2A through FIG. 2D. In FIG. 2A, the single crystal germanium substrate 10 having a (111) plane as a principal plane is prepared. The dopant of and the dopant concentration of the germanium substrate 10 are the same as those of the first embodiment. In FIG. 29, a YGO film primarily containing germanium oxide and yttrium oxide is formed as the insulating film 12. The YGO film is formed by sputtering using targets of germanium oxide ($GeO_2$) and yttrium oxide ($Y_2O_3$) and using an argon gas. The YGO film may also be formed by reactive sputtering using targets of germanium and yttrium. In FIG. 2C, the heat treatment is conducted in an oxygen gas atmosphere at a pressure of 10 atm at a heat treatment temperature of 550° C. for five minutes of heat treatment time.

Figure 6A:
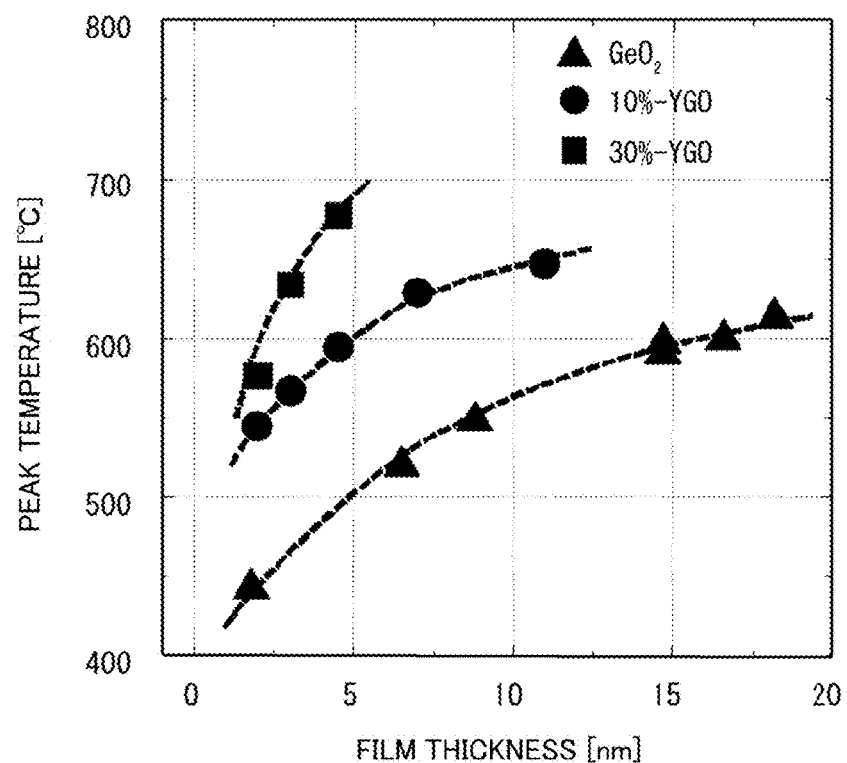
FIG. 6A is a graph of film thickness versus peak temperature at which germanium monoxide is detected in ultra-high vacuum.

The YGO film and the germanium dioxide film were analyzed by TDS. FIG. 6A is a graph of film thickness versus peak temperature at which germanium monoxide is detected in ultra-high vacuum. Triangle dots represent measurement points of the germanium dioxide film, and circular dots and square dots respectively represent measurement points of the YGO films having atomic composition ratios of yttrium (the ratio of Y to Y and Ge) of 10% and 30%. The curves are approximate curves. The rising rate of the temperature is 20° C./min, and the degree of vacuum for measurement is $2\times10^{-7}$ Pa.

As illustrated in FIG. 6A, the peak temperature of the YGO film is higher than that of the germanium dioxide film by 100° C. or greater. As the composition ratio of yttrium increases, the peak temperature further increases. This is because since yttrium oxide has an oxygen potential lower than that of germanium dioxide, yttrium oxide inhibits the release of germanium monoxide.

Figure 6B:
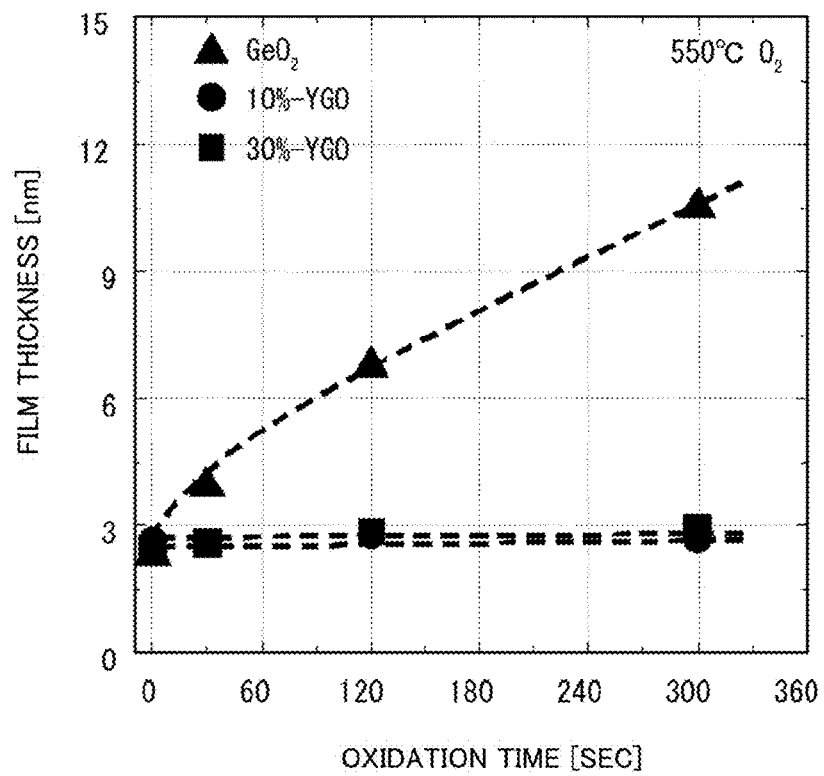
Figure 7A:
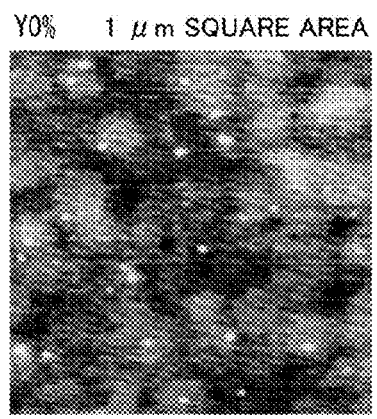
FIG. 7A through FIG. 7D are AFM images.
Figure 7B:
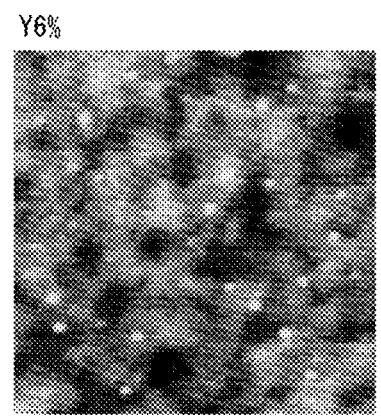
Figure 7C:
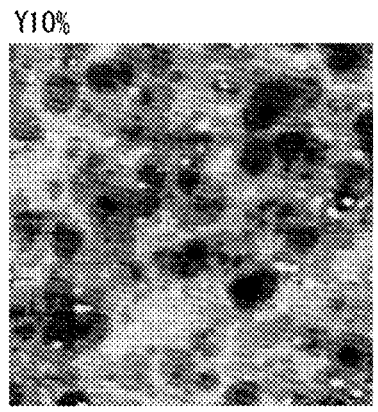
Figure 7D:
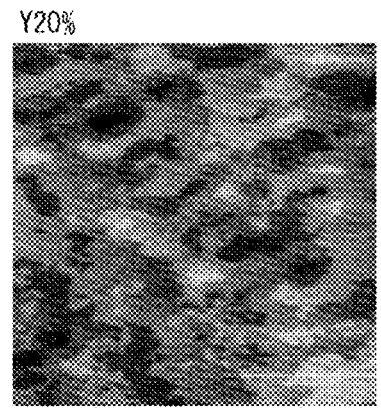

The YGO film and the germanium dioxide film were heat treated in an oxygen gas atmosphere, and then the film thickness of the insulating film was measured. The heat treatment was conducted in an oxygen gas atmosphere at a pressure of 10 atm at a heat treatment temperature of 550° C. FIG. 6B is a graph of heat treatment time versus film thickness. The dots are the same as those of FIG. 6A. As illustrated in FIG. 6B, the film thickness of the germanium dioxide film is increased by heat treatment with oxygen. The film thickness of the YGO film remains the same despite the heat treatment with oxygen. This is because the oxidation of germanium is inhibited since the insulating film 12 contains yttrium oxide, and because the movement of germanium atoms at the interface, the oxidation of germanium, and the release rate of germanium monoxide gas are balanced.

In FIG. 2B, YGO films having yttrium composition ratios of 6% (Y6%), 10% (Y10%), and 20% (Y20%) were formed as the insulating film 12. For comparison, a germanium dioxide film containing no yttrium (Y0%) was formed as the insulating film 12. The film thickness was approximately 3 nm. In FIG. 2C, heat treatment was conducted in an oxygen gas atmosphere at a pressure of 10 atm at a heat treatment temperature of 500° C. or 550° C. for five minutes of heat treatment time. After the heat treatment, the insulating film 12 is removed by hydrochloric acid or hydrofluoric acid. The surface of the germanium substrate 10 was then observed by AFM.

FIG. 7A through FIG. 7D are AFM images. The area of the AFM image is a 1 μm square area, and the heat treatment temperature is 550° C. FIG. 7A through FIG. 7D respectively present samples having yttrium composition ratios of 0%, 6%, 10%, and 20%. In the samples having yttrium composition ratios of 6%, 10%, and 20%, a step-and-terrace structure is observed.

The half width of the frequency distribution within a 1 μm square area was measured by AFM. The measurement results are as follows.

| Heat treatment temperature | Y composition ratio | RMS |
|---|---|---|
| 550° C. | 6% | 0.43 ± 0.04 nm |
| 550° C. | 10% | 0.43 ± 0.04 nm |
| 550° C. | 20% | 0.33 ± 0.04 nm |
| 500° C. | 6% | 0.58 ± 0.04 nm |
| 500° C. | 10% | 0.60 ± 0.04 nm |
| 500° C. | 20% | 0.58 ± 0.04 nm |
| Without heat treatment | 0% | 0.60 ± 0.04 nm |

The samples heat treated at a heat treatment temperature of 500° C. have RMS approximately the same as the RMS of the sample without heat treatment. A step-and-terrace structure is not observed. In contrast, the samples heat treated at a heat treatment temperature of 550° C. have half widths less than the half width of the sample without heat treatment regardless of the atomic composition ratio of yttrium.

As described above, when the heat treatment temperature is 500° C., the surface of the germanium substrate 10 is not planarized. When the heat treatment temperature is 550° C., the surface of the germanium substrate 10 is planarized. This is because the movement of germanium atoms is not sufficient at 500° C., whereas the movement of germanium atom, the oxidation rate of germanium, and the release rate of germanium monoxide become balanced at 550° C.

When the sample of which the insulating film 12 contains yttrium oxide is heat treated with oxygen at 550° C., the half width of the frequency distribution becomes 0.5 nm or less. The half width of the frequency distribution is typically approximately RMS×2.35σ.

Figure 8A:
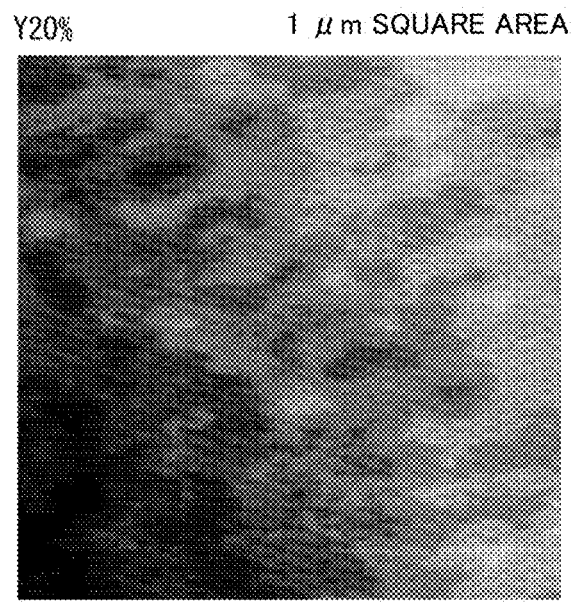
FIG. 8A is an AFM image.
Figure 8B:
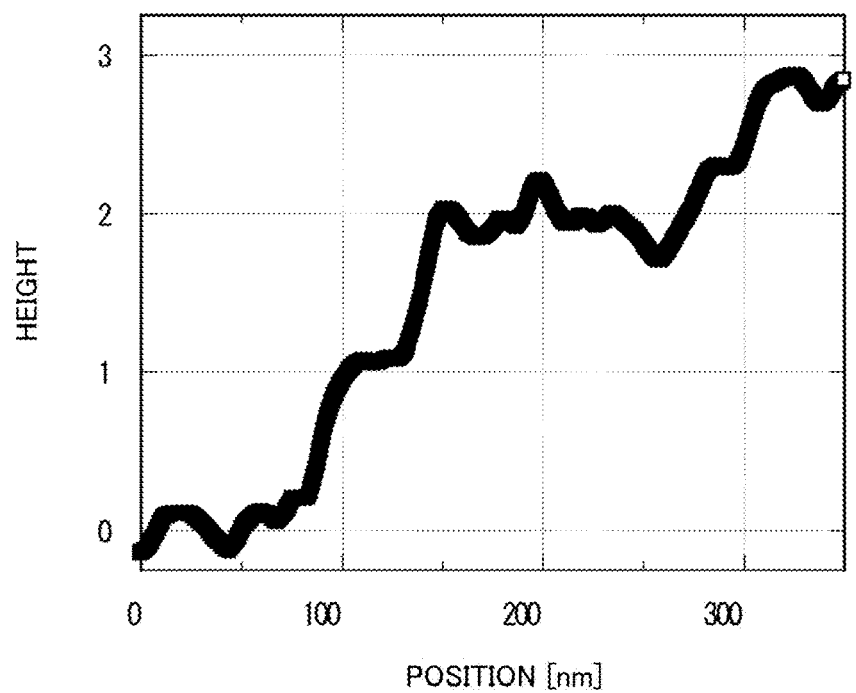
FIG. 8B illustrates a cross-section profile.

FIG. 8A is an AFM image, and FIG. 8B illustrates a cross-section profile. The heat treatment was conducted in an oxygen gas atmosphere at a pressure of 10 atm at a heat treatment temperature of 550° C. for five minutes of heat treatment time. In FIG. 8A, the image is corrected so that terrace faces are parallel. As illustrated in FIG. 8A, a step-and-terrace structure is observed. In FIG. 8B, the height is normalized by 0.326 μm. Here, 0.326 μm corresponds to two bonds of Ge atoms in a unit of a regular tetrahedral binding structure making up a diamond structure. As illustrated in FIG. 8A and FIG. 8B, a step-and-terrace structure is observed. This demonstrates that the flatness of the surface of the germanium substrate 10 is very good.

Figure 9:
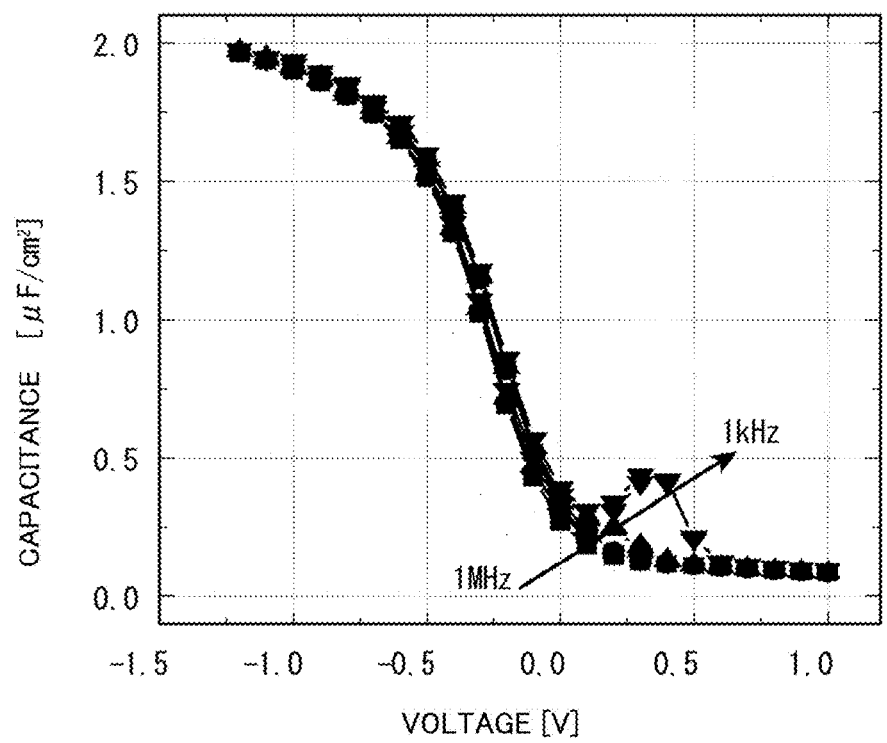
FIG. 9 illustrates C—V characteristics in a second embodiment.

For the sample having a yttrium composition ratio of 10% and heat treated at a heat treatment temperature of 550° C., the metal film 16 was formed on the insulating film 12 as illustrated in FIG. 2D, and C—V measurement was conducted at room temperature. FIG. 9 illustrates C—V characteristics in the second embodiment. Dots represent measurement points. The measurement frequency is between 1 MHz and 1 kHz. The measurement frequency decreases as it goes from the lower left to the upper right in the direction of the arrow. As illustrated in FIG. 9, at 1 kHz, hysteresis is observed between 0 V and 0.5 V. However, at other frequencies, hysteresis is hardly observed, and the capacitance sharply changes between the accumulation state and the inversion state. This reveals that a good MIS structure is formed in the second embodiment.

Furthermore, an FET with a gate length of 100 μm and a gate width of 25 μm was fabricated with use of the insulating film 12 containing 10% of yttrium, and the mobility thereof was measured. The mobility was measured at room temperature by split CV method. The insulating film 12 had an EOT (Equivalent Oxide Thickness) of 0.8 nm. The mobility when the surface electron density was $1\times10^{13}$ cm$^{-2}$ was approximately 380 cm$^2$/Vs and good.

Third Embodiment

A third embodiment uses scandium oxide ($Sc_2O_3$) as a substance with a low oxygen potential.

The method of fabricating a semiconductor structure in accordance with the third embodiment is the same as that of the first embodiment illustrated in FIG. 2A through FIG. 2D. In FIG. 2A, prepared is the single crystal germanium substrate 10 having a (111) plane as a principal plane. The dopant of and the dopant density of the germanium substrate 10 are the same as those of the first embodiment. In FIG. 2B, an ScGO film primarily containing germanium oxide and scandium oxide is formed as the insulating film 12. The ScGO film is formed by sputtering using targets of germanium oxide (GeO$_2$) and scandium oxide (Sc$_2$O$_3$) and using an argon gas. The ScGO film may also be formed by reactive sputtering using targets of germanium and scandium. In FIG. 2C, the heat treatment was conducted in an oxygen gas atmosphere at a pressure of 10 atm at a heat treatment temperature of 550° C. for five minutes of heat treatment time.

Figure 10:
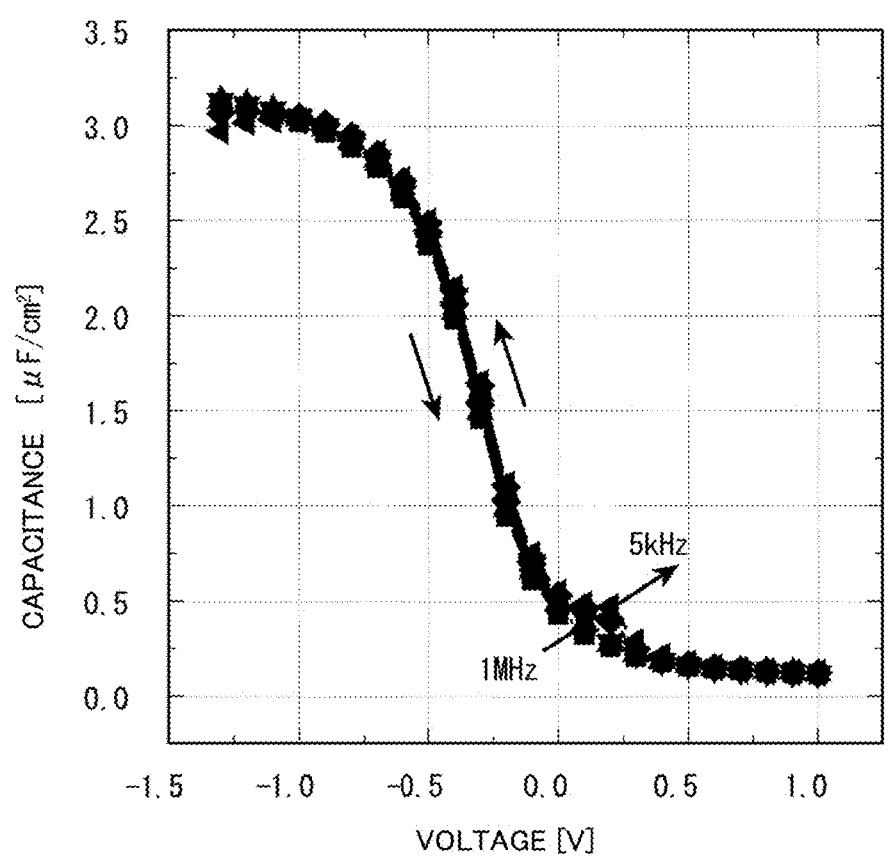
FIG. 10 illustrates C—V characteristics in a third embodiment.

The metal film 16 was formed on the insulating film 12 as illustrated in FIG. 2D, and C—V measurement was conducted at room temperature. FIG. 10 illustrates C—V characteristics in the third embodiment. Dots represent measurement points. The measurement frequency is between 1 MHz and 5 kHz. The measurement frequency decreases as it goes from the lower left to the upper right in the direction of the arrow. As illustrated in FIG. 10, hysteresis is hardly observed, and the capacitance between the accumulation state and the inversion state sharply changes. When the flatness of the surface of the germanium substrate 10 is had, a good MIS structure is not obtained. Thus, also in the third embodiment, the surface of the germanium substrate 10 is considered to be planarized.

Figure 11:
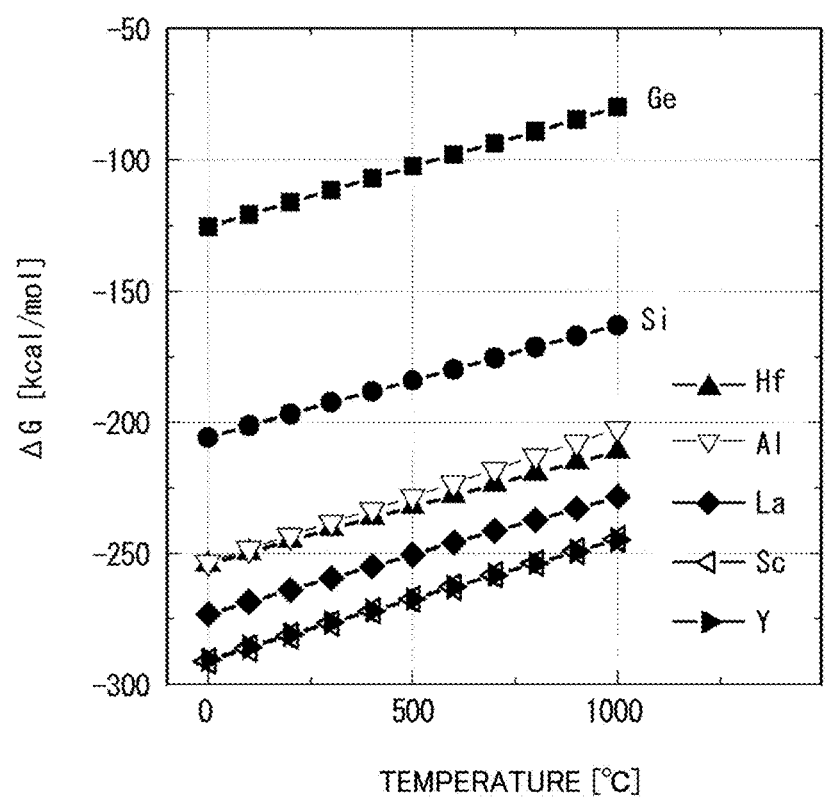
FIG. 11 is a graph of temperature versus oxygen potential.

FIG. 11 is a graph of temperature versus oxygen potential with respect to one mole of oxygen in the oxides of various materials. As oxygen potential (AG), presented are the oxygen potentials of oxides of germanium, silicon, hafnium (Hf), aluminum (Al), lanthanum (La), scandium, and yttrium. As illustrated in FIG. 11, the oxygen potentials of the oxides of silicon, hafnium, aluminum, lanthanum, scandium, and yttrium are less than the oxygen potential of germanium dioxide.

Thus, the oxide of silicon, hafnium, aluminum, lanthanum, scandium, or yttrium may be used as a substance with an oxygen potential lower than that of germanium dioxide. Especially, the use of yttrium oxide or scandium oxide having a low oxygen potential is preferable. In addition, the insulating film 12 preferably fails to react with a metal film and germanium. From this perspective, yttrium oxide, scandium oxide, or aluminum oxide is preferable as the substance. The substance is not limited to one of the above substances, and may contain two or more substances. For example, the substance preferably primarily contains at least one of germanium nitride, yttrium oxide, scandium oxide, and aluminum oxide.

Fourth Embodiment

Figure 12A:
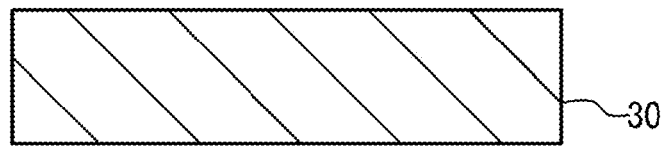
FIG. 12A through FIG. 12C are cross-sectional views illustrating a method of fabricating a semiconductor structure in accordance with a fourth embodiment.
Figure 12B:
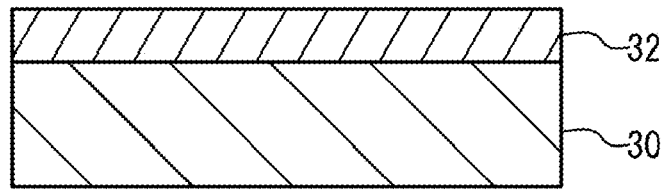
Figure 12C:
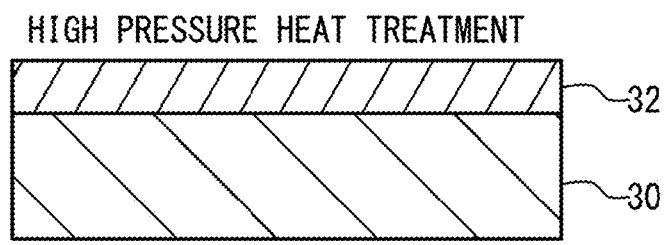

FIG. 12A through FIG. 12C are cross-sectional views illustrating a method of fabricating a semiconductor structure in accordance with a fourth embodiment. As illustrated in FIG. 12A, prepared is a germanium layer 30. The germanium layer 30 may be a single crystal germanium substrate, or may be a germanium film formed on a substrate (for example, an insulating substrate such as a silicon substrate or a glass substrate). Alternatively, the germanium layer 30 may be high-purity germanium, or may contain impurities. For example, the germanium layer 30 may be n-type or p-type germanium. Furthermore, the germanium layer 30 may contain silicon as long as the effect of the above experiment is obtained. The composition ratio of silicon is required to be approximately 10 atomic % or less of the total. The germanium layer 30 has, for example, a (100) plane, a (110) plane, or a (111) plane as a principal plane.

As illustrated in FIG. 12B, an insulating film 32 (a first insulating film) is formed on the upper surface of the germanium layer 30. The insulating film 32 primarily contains germanium dioxide and a substance having an oxygen potential lower than that of germanium dioxide. The substance having an oxygen potential significantly lower than that of germanium oxide is germanium nitride, yttrium oxide, scandium oxide, or aluminum oxide. Since the insulating film 32 is used as a gate insulator, the insulating film 32 preferably has a large permittivity. The insulating film 32 preferably fails to react with the germanium layer 30 and a metal layer such as a gate electrode.

The insulating film 32 is formed by, for example, sputtering. Since the insulating film 32 is used as a gate insulator in the end, the film thickness of the insulating film 32 is preferably 3 nm or less of physical film thickness, more preferably 2 nm or less After the insulating film 32 is formed, the insulating film 32 may be thinned by etching. The atomic composition ratio of the substance with a low oxygen potential in the insulating film 32 used as a gate insulator is preferably 5 atomic % or greater, more preferably 10 atomic % or greater to inhibit sublimation of germanium monoxide and to inhibit oxidation of the germanium substrate 30. To provide a good interface between the germanium layer 30 and the insulating film 32, the atomic composition ratio of the substance is preferably 50 atomic % or less, more preferably 30 atomic % or less. The atomic composition ratio is a ratio of nitrogen to oxygen and nitrogen when the substance is germanium nitride, and is a ratio of yttrium to yttrium and germanium when the substance is yttrium oxide.

As illustrated in FIG. 12C, the germanium layer 30 and the insulating film 32 are heat treated in an oxidizing gas atmosphere at a pressure at which the gas pressure at room temperature is greater than atmospheric pressure at a heat treatment temperature greater than the temperature at which the insulating film 32 is formed. This process improves the flatness of the surface of the germanium layer 30 (the interface between the germanium layer 30 and the insulating film 32). For example, the half width of frequency to height within a 1 μm square area of the upper surface of the germanium layer 30 is allowed to be 0.7 nm or less. The half width is more preferably 0.6 nm or less, further preferably 0.5 nm or less.

The oxidizing gas for the heat treatment may be, for example, an oxygen gas, or a mixed gas of oxygen and an inert gas. The inert gas may be a nitrogen gas, a XVIII-family element gas, or a mixed gas of a nitrogen gas and a XVIII-family element gas. The XVIII-family element gas is helium, neon (Ne), argon, krypton (Kr), xenon (Xe), radon (Rn), or the like. The heat treatment temperature is preferably a temperature at which germanium atoms can move on the surface of the germanium layer 30, and is preferably, for example, 400° C. or greater, more preferably 500° C. or greater, further preferably 520° C. or greater. To inhibit further oxidation of the germanium layer 30, and to reduce heat stress or the like, the heat treatment temperature is preferably 700° C. or less, more preferably 600° C. or less, further preferably 580° C. or less. The partial pressure of oxygen to keep the oxidation rate of the surface of the germanium layer 30 appropriate depends on the concentration of the substance with a low oxygen potential, the heat treatment temperature, and the initial film thickness of the insulating film 32, and is preferably configured as appropriate. For example, the partial pressure of oxygen at room temperature is preferably 2 atm or greater, more preferably 5 atm or greater, further preferably 10 atm or greater or 20 atm or greater. The gas pressure at room temperature is preferably 70 atm or less, more preferably 50 atm or less.

Fifth Embodiment

Figure 13A:
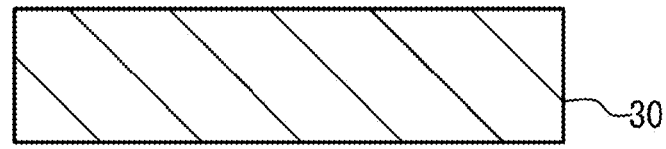
FIG. 13A through FIG. 13D are cross-sectional views illustrating a method of fabricating a semiconductor structure in accordance with a fifth embodiment.
Figure 13B:
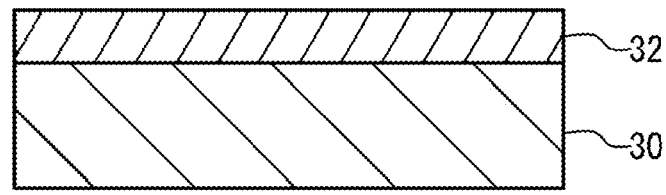

A fifth embodiment forms an insulating film on an insulating film, the insulating films having different compositions. FIG. 13A through FIG. 13D are cross-sectional views illustrating a method of fabricating a semiconductor structure in accordance with a fifth embodiment. As illustrated in FIG. 13A, the germanium layer 30 is prepared as in the fourth embodiment. As illustrated in FIG. 13B, the insulating film 32 is formed on the germanium layer 30. The insulating film 32 is the same as that of the fourth embodiment. The insulating film 32 is formed by, for example, sputtering. Alternatively, the insulating film 32 is formed by exposing the native germanium oxide film on the surface of the germanium layer 30 to nitrogen plasma. For example, when a metal nitride film as an insulating film 34 (see FIG. 13D) is formed on the surface of the germanium layer 30 by reactive sputtering using nitrogen plasma, the insulating film 32 is formed by exposing the native germanium oxide film on the surface of the germanium layer 30 to nitrogen plasma. Since the insulating film 32 is used as a gate insulator, the film thickness of the insulating film 32 is preferably 3 nm or less of physical film thickness, more preferably 2 nm or less, and is preferably 1 nm or greater.

Figure 13C:
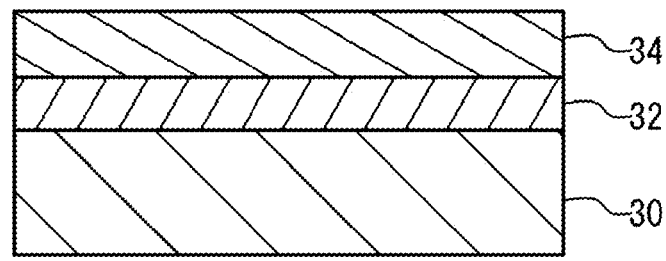

As illustrated in FIG. 13C, formed on the insulating film 32 is the insulating film 34 having a composition different from the composition of the insulating film 32. Since the insulating film 34 functions as a gate insulator, the insulating film 34 is, for example, a high permittivity (High-k) insulating film, and preferably has a permittivity greater than the permittivity of, for example, silicon oxide. The insulating film 34 may be, for example, at least one of an aluminum nitride film, a hafnium oxide film, a zirconium oxide film, a titanium oxide film, an aluminum oxide film, and an oxide film of a rare earth element (for example, a lanthanum oxide film).

Figure 13D:
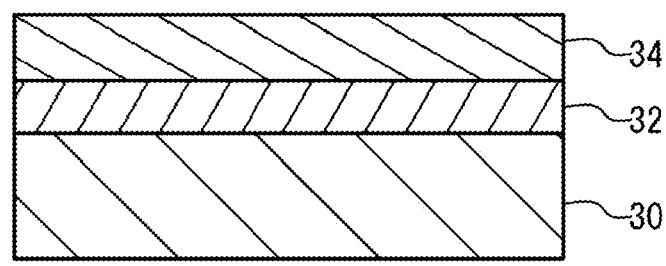

As illustrated in FIG. 13D, after the insulating film 34 is formed, the germanium layer 30, the insulating film 32, and the insulating film 34 are heat treated in an oxidizing gas atmosphere at a pressure at which the gas pressure at room temperature is greater than atmospheric pressure at a heat treatment temperature greater than the temperature at which the insulating film 32 and the insulating film 34 are formed. As described above, the heat treatment may be conducted after the separate insulating film 34 is formed on the insulating film 32 as long as the film thickness of the insulating film 34 is within a range where the total capacitance film thickness of the insulating film 34 and the insulating film 32 (for example, EOT: Equivalent Oxide Thickness) can be used for a gate insulator. Since the insulating film 34 is used as agate insulator, the film thickness of the insulating film 34 is preferably 3 nm or less of physical film thickness, more preferably 2 nm or less, and is preferably 1 nm or greater.

Sixth Embodiment

Figure 14:
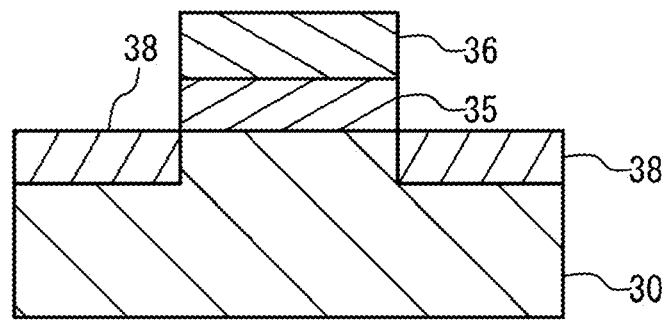
FIG. 14 is a cross-sectional view of a semiconductor device in accordance with a sixth embodiment.

FIG. 14 is a cross-sectional view of a semiconductor device in accordance with a sixth embodiment. A gate electrode 36 is formed on the germanium layer 30 through a gate insulator 35. A source or drain region 38 is formed in the germanium layer 30 located at both sides of the gate electrode 36. The germanium layer 30 is p-type, and the source or drain region 38 is n-type. The germanium layer 30 may be n-type, and the source or drain region 38 may be p-type. The insulating film 32 of the fourth embodiment or the insulating films 32 and 34 of the fifth embodiment are used as the gate insulator 35. This configuration improves the flatness of the surface of the germanium layer 30. The transistor characteristics are improved by improving the flatness of the surface of the germanium layer 30. In addition, the long-term reliability of the gate insulator 35 is improved.

The sixth embodiment applies the semiconductor structure according to any one of the fourth embodiment and the fifth embodiment to a MOSFET, but the semiconductor structure according to any one of the fourth and fifth embodiments may be applied to semiconductor devices other than a MOSFET.

The above description describes the embodiments that improve the flatness of the surface of the germanium layer. Hereinafter, a description will be given of embodiments that inhibit the deterioration of an insulating film containing germanium oxide, and the deterioration of an interface between the insulating film and a germanium layer. The fabrication process after the formation of the insulating film on the germanium layer (or a germanium substrate) desorbs germanium monoxide from the insulating film. Alternatively, the surface of the germanium layer is oxidized through the insulating film. As described above, the insulating film and the interface between the insulating film and the germanium layer deteriorate. The following embodiments inhibit such deteriorations.

Seventh Embodiment

Figure 15A:
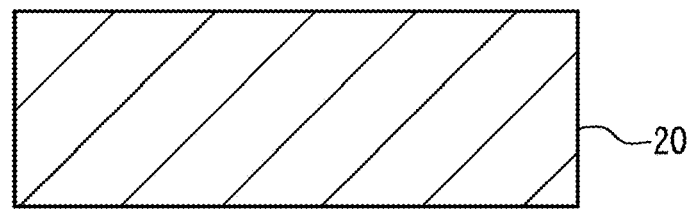
FIG. 15A through FIG. 15D are cross-sectional views illustrating a method of fabricating a semiconductor structure in accordance with a seventh embodiment.

FIG. 15A through FIG. 15D are cross-sectional views illustrating a method of fabricating a semiconductor structure in accordance with a seventh embodiment. As illustrated in FIG. 15A, a germanium substrate 20 is prepared. The germanium substrate 20 has a (111) plane as a principal plane, is doped with Ga, has a dopant concentration of approximately $1\times10^{16}$ cm$^{-3}$, and is p-type.

Figure 15B:
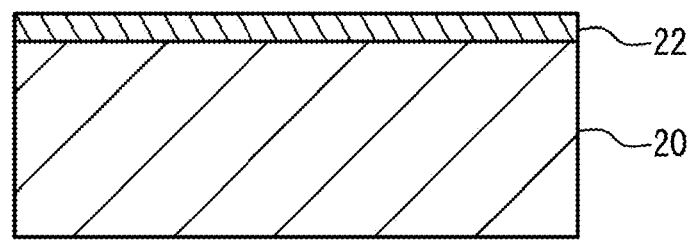
Figure 15C:
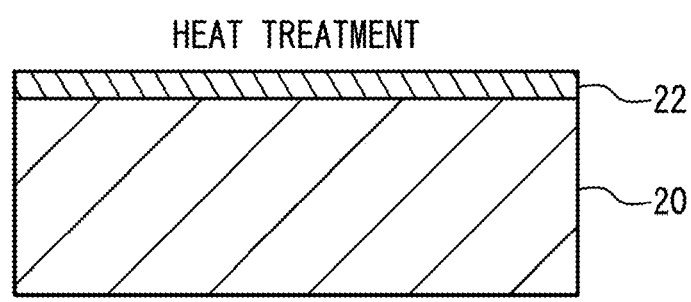

As illustrated in FIG. 15B, a YGO film primarily containing germanium oxide and yttrium oxide is formed as an insulating film 22. The YGO film is formed by simultaneously co-sputtering germanium oxide and yttrium oxide. As illustrated in FIG. 15C, the germanium substrate 20 and the insulating film 22 are heat treated (Post Deposition Anneal) in a nitrogen gas atmosphere (gas of 100% nitrogen) at atmospheric pressure at a heat treatment temperature of 500° C. for 30 seconds of heat treatment time.

Figure 15D:
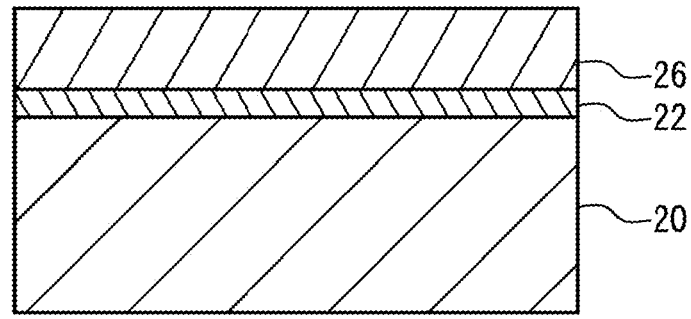

As illustrated in FIG. 15D, in the sample on which C—V measurement is to be conducted and of which the leakage current is to be measured, a gold film as a metal film 26 is formed on the surface of the insulating film 22.

Fabricated were samples with different atomic composition ratios of yttrium (a ratio of Y to Y and Ge: also referred to as a Y concentration) in the insulating film 22. As a comparative example, a sample with a yttrium composition ratio of 0% was fabricated. The comparative example was heat treated in an oxygen gas atmosphere at 70 atm at 500° C. after the germanium oxide film as the insulating film 22 was formed.

Figure 16:
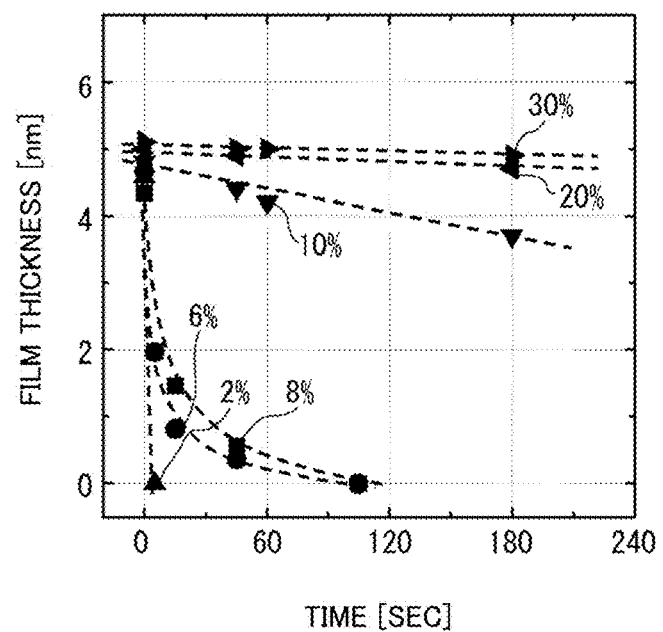
FIG. 16 is a graph of etching time versus the film thickness of an insulating film in the seventh embodiment.

The insulating films 22 with different yttrium composition ratios were etched with use of pure water. FIG. 16 is a graph of etching time versus the film thickness of the insulating film in the seventh embodiment. Presented are the results of the samples having yttrium composition ratios (Y concentrations) of 2%, 6%, 8%, 10%, 20% and 30%. Dots represent measurement points, and the dashed lines represent approximate lines. As illustrated in FIG. 16, when the sample having a yttrium composition ratio of 2% to 8% is immersed in pure water, the film thickness of the insulating film 22 sharply decreases. In contrast, the etching rate of the sample with yttrium composition ratio of 10% is small even when the sample with a yttrium composition ratio of 10% is immersed in pure water. Furthermore, the etching rate of the sample with a yttrium composition ratio of 20% to 30% is smaller. This demonstrates that the reaction between germanium oxide and water is inhibited in the insulating film 22 having a yttrium composition ratio of 10% or greater.

Figure 17:
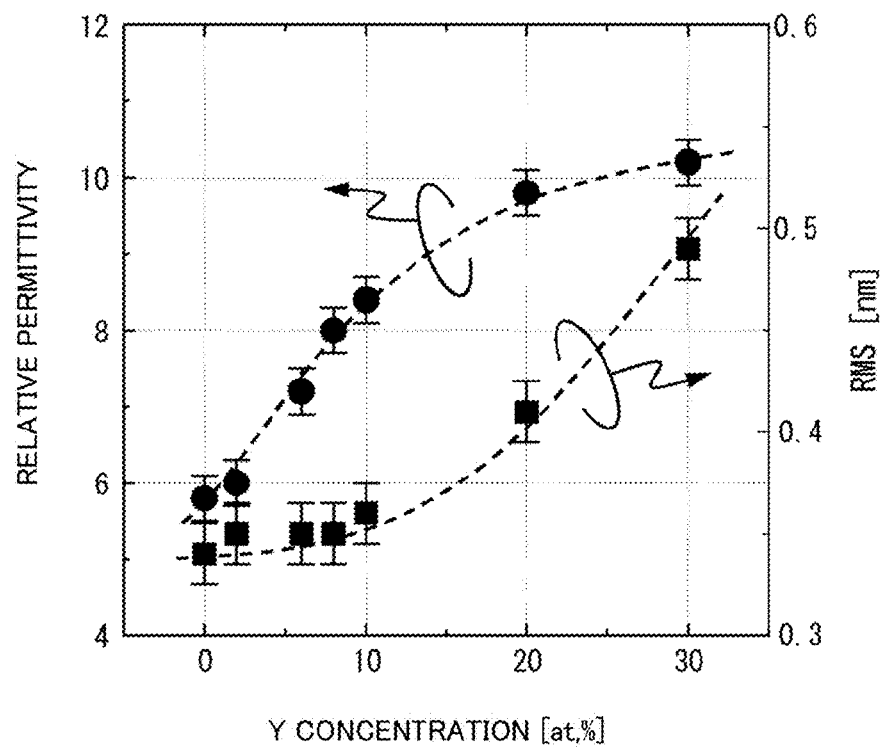
FIG. 17 is a graph of the Y concentration of the insulating film versus the relative permittivity of the insulating film and the RMS of the upper surface of the insulating film in the seventh embodiment.

FIG. 17 is a graph of the Y concentration of the insulating film 22 versus the relative permittivity of the insulating film 22 and the RMS of the upper surface of the insulating film 22 in the seventh embodiment. Dots represent measurement points, bars represent the margin of error, and the dashed lines represent approximate lines. As illustrated in FIG. 17, when the yttrium composition ratio is 0% (germanium oxide), the relative permittivity is approximately 6. As the yttrium composition ratio increases, the relative permittivity increases. When the yttrium composition ratio is 10%, the relative permittivity is approximately 8.5. When the yttrium composition ratio is between 20% and 30%, the relative permittivity is approximately 10. The RMS is approximately 0.35 nm and hardly changes when the yttrium composition ratio is 10% or less. When the yttrium composition ratio is 20%, the RMS is approximately 0.4 nm and slightly high. When the yttrium composition ratio is 30%, the RMS is approximately 0.5 nm. As described above, as the yttrium composition ratio increases, the relative permittivity increases. However, when the yttrium composition ratio exceeds 20%, the flatness (RMS) of the surface of the insulating film 22 is low.

Figure 18A:
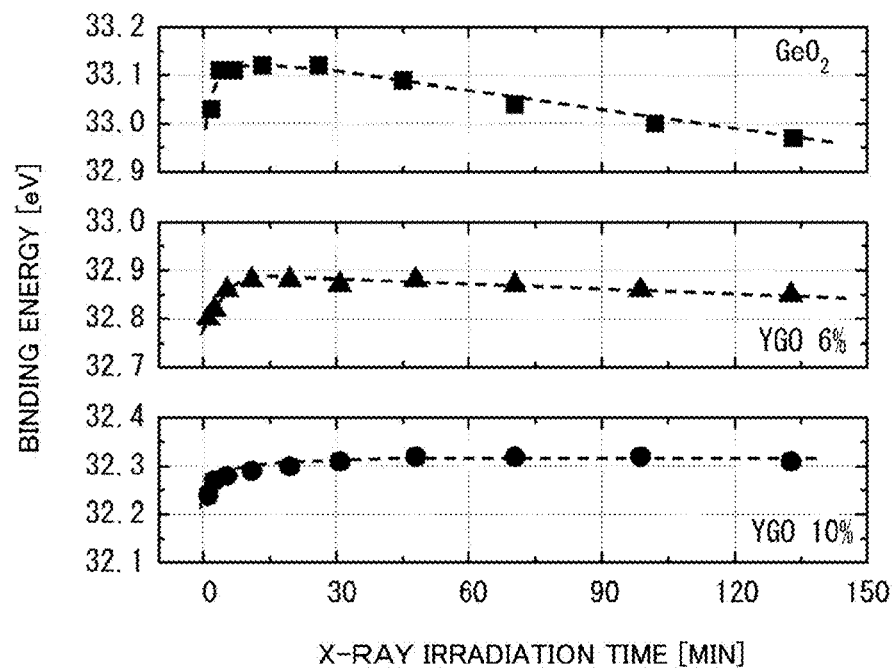
FIG. 18A is a graph of X-ray irradiation time versus the binding energy of $Ge^{4+}3d$ in the insulating film in the seventh embodiment.
Figure 18B:
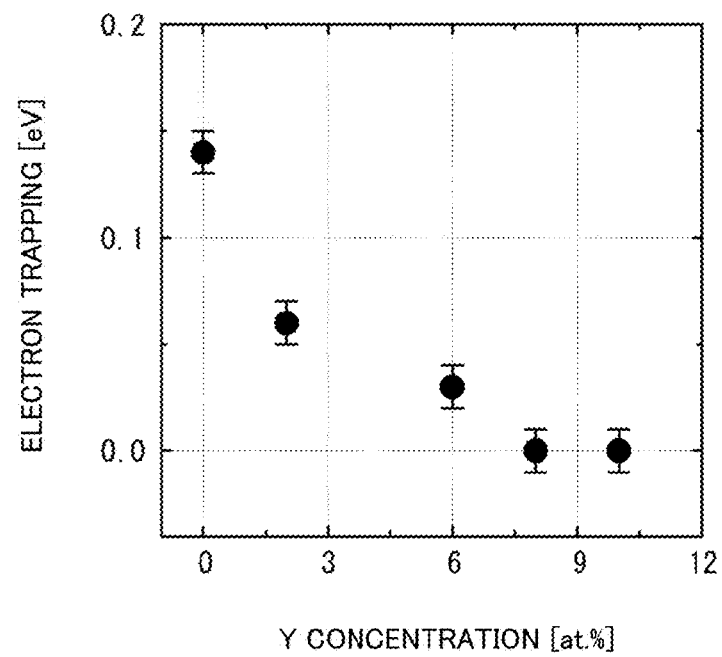
FIG. 18B is a graph of Y concentration versus electron-trapping energy in the insulating film in the seventh embodiment.

The insulating films 22 with different yttrium composition ratios were analyzed by XPS (X-ray Photoelectron Spectroscopy). FIG. 18A is a graph of X-ray irradiation time versus the binding energy of $Ge^{4+}3d$ in the insulating film 22 in the seventh embodiment. FIG. 18B is a graph of Y concentration versus electron-trapping energy in the insulating film 22 in the seventh embodiment. As illustrated in FIG. 18A, the sample of which the insulating film 22 is germanium oxide (the yttrium composition ratio is 0%) has the highest binding energy when the X-ray irradiation time is approximately 10 seconds. As the X-ray irradiation time increases, the binding energy decreases. In the sample with a yttrium composition ratio of 6%, the decrease from the peak of the binding energy is small. In the sample with a yttrium composition ratio of 10%, the binding energy hardly decreases.

In FIG. 18B, the electron-trapping energy represents the decrease in the binding energy in FIG. 18A. As illustrated in FIG. 18B, when the yttrium composition ratio is 8% or greater, the electron-trapping energy is approximately zero. This demonstrates that the insulating film 22 has almost no electron capture center in the insulating film 22 when the yttrium composition ratio is 8% or greater.

Figure 19:
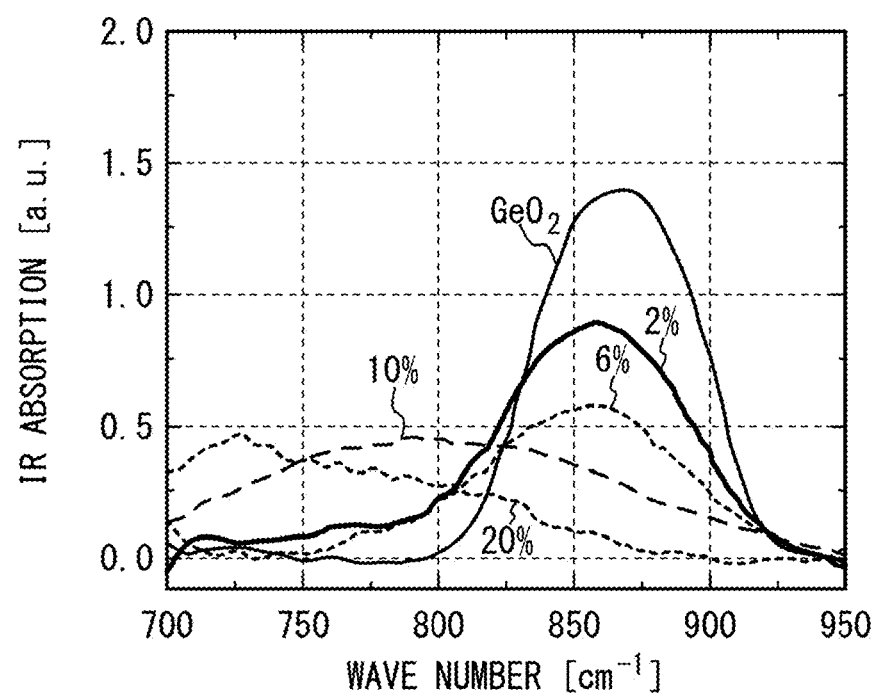
FIG. 19 is a graph of wave number versus the infrared (IR) absorption of the insulating film in the seventh embodiment.

The infrared absorption of each of the insulating films 22 with different yttrium composition ratios were measured. FIG. 19 is a graph of wave number versus the infrared (IR) absorption of the insulating film 22 in the seventh embodiment. As illustrated in FIG. 19, compared with the germanium oxide film, as the yttrium composition ratio of the YGO film increases such as 2%, 6%, 10%, and 20%, the peak of absorption shifts toward a low wave number. In addition, the peak is broadened. Especially when the yttrium composition is 10% or greater, the shift of the absorption peak is large, and the peak is significantly broadened. This demonstrates that the network structure in the germanium oxide ($GeO_2$) film greatly changes by addition of yttrium.

As described in FIG. 18A through FIG. 19, when germanium oxide is doped with yttrium oxide, the binding state between germanium and oxygen greatly changes. As the yttrium composition ratio increases, the bond between germanium and oxygen becomes stable. This is considered to be because yttrium oxide has an oxygen potential lower than that of germanium oxide as described in FIG. 11.

Figure 20:
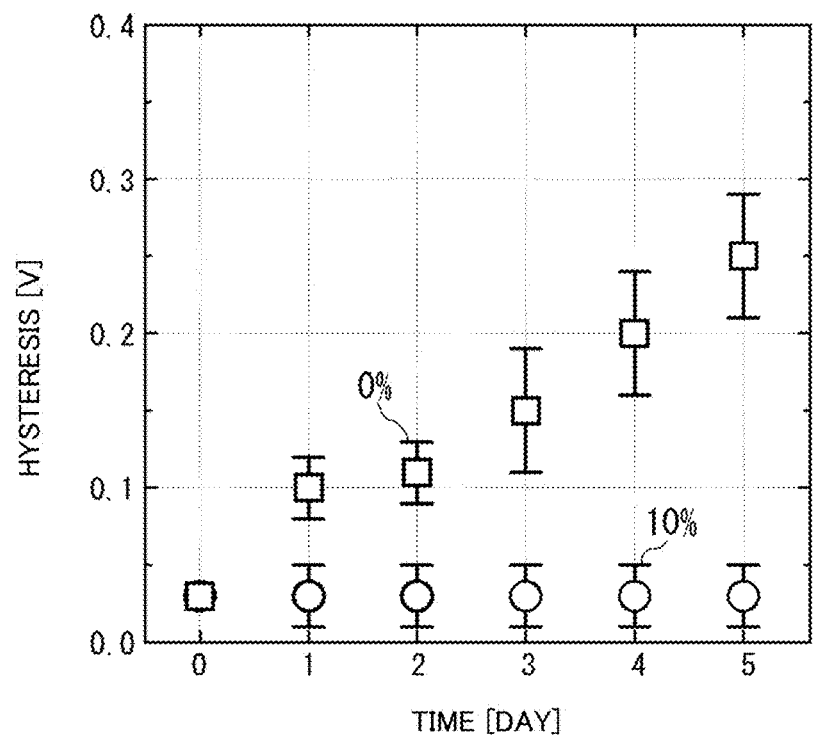
FIG. 20 is a graph of exposing time versus hysteresis in C—V measurements in the semiconductor structure of the seventh embodiment.

After the insulating film 22 was heat treated as illustrated in FIG. 15C, the sample was exposed in the atmosphere. Then, the metal film 26 was formed on the insulating film 22 as illustrated in FIG. 15D, and C—V measurement was conducted. The insulating film 22 had a film thickness of approximately 10 nm. FIG. 20 is a graph of exposing time (day) versus the magnitude of hysteresis in the C—V measurement in the semiconductor structure of the seventh embodiment. The measured samples are a sample with a yttrium composition ratio of 10% and a sample with a yttrium composition ratio of 0%.

As illustrated in FIG. 20, in the sample of which the insulating film 22 is germanium oxide (the yttrium composition ratio is 0%), as the exposing time increases in a unit of days, the hysteresis increases. This demonstrates that the interface state between the insulating film 22 and the germanium substrate 20 deteriorates. In contrast, in the sample with a yttrium composition ratio of 10%, the hysteresis remains almost the same. As described above, when the sample with a yttrium composition ratio of 0% is exposed in the atmosphere, the interface state deteriorates. In contrast, the interface state of the sample with a yttrium composition ratio of 10% remains the same and is stable even when the sample is exposed in the atmosphere.

Figure 21:
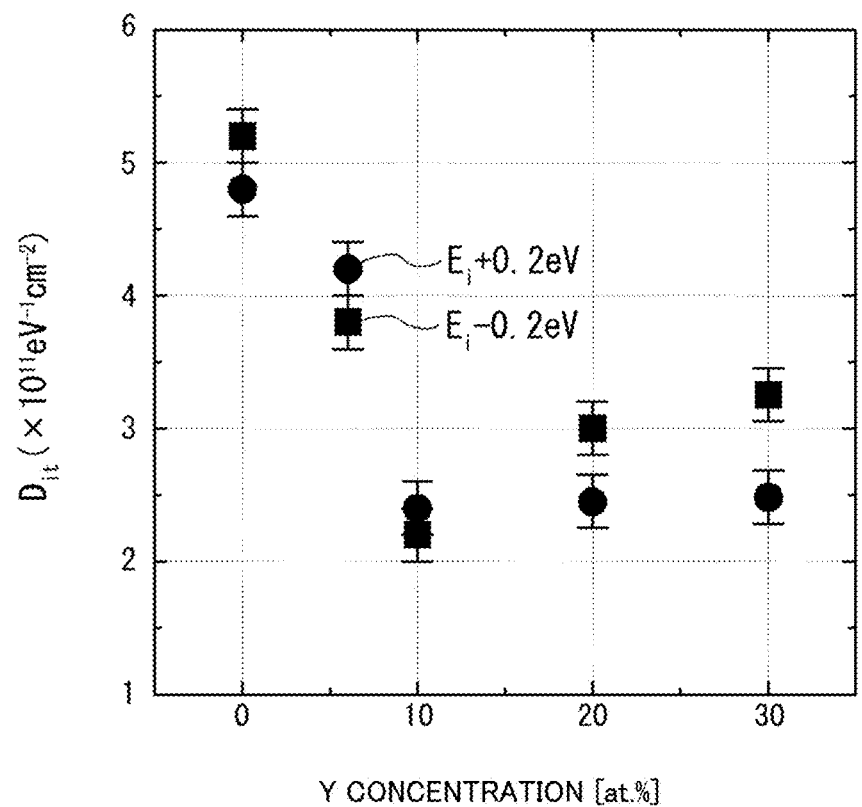
FIG. 21 is a graph of the Y concentration of the insulating film versus interface state density Dit in the semiconductor structure of the seventh embodiment.

FIG. 21 is a graph of the Y concentration of the insulating film versus interface state density Dit in the semiconductor structure of the seventh embodiment insulating film. Ei+0.2 eV represents the interface state density at +0.2 eV from the center of an energy band gap Ei, and Ei−0.2 eV represents the interface state density at −0.2 eV from the center of the energy band gap Ei.

As illustrated in FIG. 21, the sample of which the insulating film 22 is germanium oxide has an interface state density of approximately $5 \times 10^{11}$ $eV^{-1}$ $cm^{-2}$. As the yttrium composition ratio increases, the interface state density decreases. The sample with a yttrium composition ratio of 10% has the lowest interface state density. When the yttrium composition ratio further increases to 20%, the interface state density becomes higher. When the yttrium composition ratio is 30%, the interface state density is further higher. As described above, when the yttrium composition ratio is 6% or greater, the interface state density is reduced. When the yttrium composition ratio is 10% or greater and 20% or less, the interface state density is further reduced.

Figure 22:
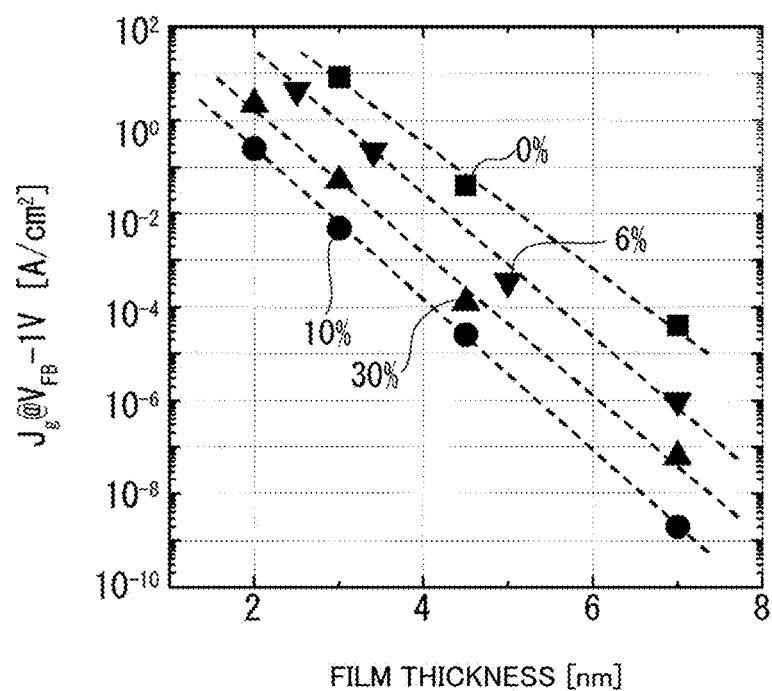
FIG. 22 is a graph of the film thickness of the insulating film versus the leakage current Jg of the insulating film in the seventh embodiment.

FIG. 22 is a graph of the film thickness of the insulating film versus the leakage current Jg of the insulating film in the seventh embodiment. Dots represent measurement points, and the dashed lines represent approximate lines. The leakage current Jg is a leakage current when voltage Vg is applied to the metal film 26 in reference to a metal film (not illustrated in FIG. 15D) on the lower surface of the germanium substrate 20. Voltage Vg is $V_{FB}-1$ V where a flat band defined in the C—V measurement is $V_{FB}$.

As illustrated in FIG. 22, the sample of which the insulating film 22 is germanium oxide (the yttrium composition ratio is 0%) has a large leakage current. The sample with a yttrium composition ratio of 6% has a smaller leakage current. The sample with yttrium composition ratio of 10% has a further smaller leakage current. The sample with a yttrium composition ratio of 30% has a slightly larger leakage current. As described above, the sample with a yttrium composition ratio of 10% has the lowest leakage current. When the yttrium composition ratio is 6% or greater, the leakage current is reduced. When the yttrium composition ratio is 10% or greater and 30% or less, the leakage current is further reduced.

FETs were fabricated with the semiconductor structures of the seventh embodiment having the insulating films 22 with different yttrium composition ratios. Used as the germanium substrate 20 was an n-type germanium substrate to fabricate a p-type FET. Used as the germanium substrate 20 was an n-type germanium substrate having a (100) plane as a principal plane to fabricate up-type FET. Furthermore, the EOT of the insulating film 22 was made to be approximately 3 nm. Carrier number and mobility $\mu_{eff}$ at room temperature were obtained by split CV method where a gate length was 100 μm and a gate width was 25 μm. The split CV method is a method that derives the carrier number from integration of the CV measurement, and obtains mobility from the carrier number and I-V measurement.

Figure 23A:
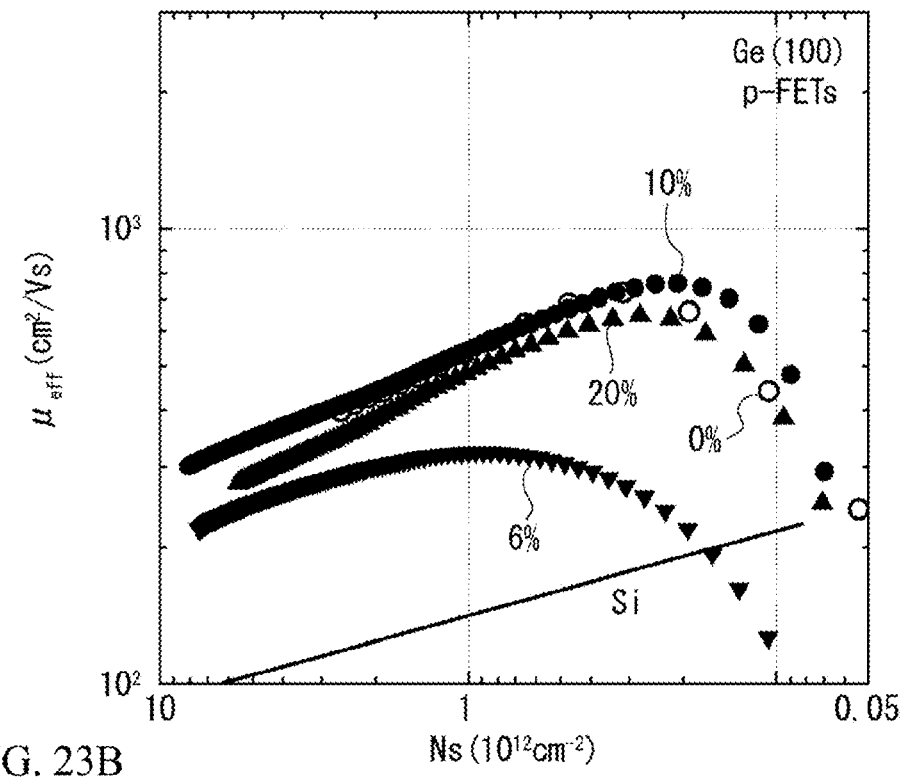
FIG. 23A and FIG. 23B are graphs of surface electron density $N_s$ versus mobility $\mu_{eff}$ in the semiconductor structure of the seventh embodiment.
Figure 23B:
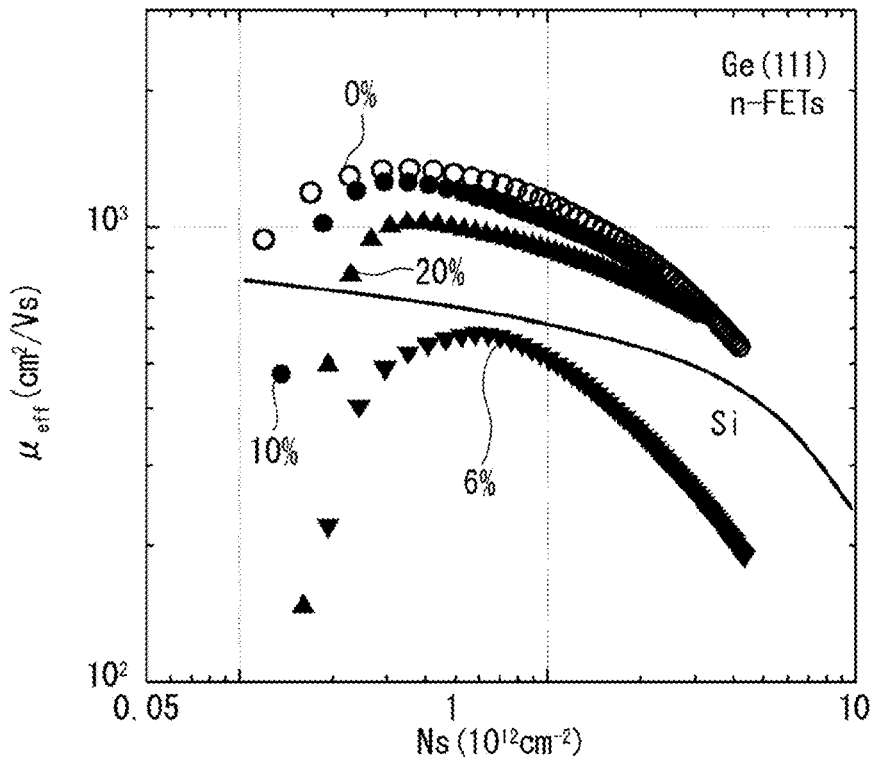

FIG. 23A and FIG. 23B are graphs of surface electron density $N_s$ versus mobility $\mu_{eff}$ in the semiconductor structure of the seventh embodiment. FIG. 23A presents Hall mobility in a p-type FET, and FIG. 23B presents electron mobility in an n-type FET. The gate voltage was applied to the gate electrode to change the surface electron density $N_s$, and then mobility $\mu_{eff}$ was measured. Dots represent measurement points. The solid line indicates typical mobility in a silicon MOSFET.

As illustrated in FIG. 23A and FIG. 23B, in the p-type FET and the n-type FET, when the yttrium composition ratio is 10% or 20%, Hall mobility and electron mobility are approximately the same as those of the sample of which the insulating film 22 is germanium oxide (the yttrium composition ratio is 0%). The mobility is significantly higher than the typical mobility in the silicon MOSFET. When the yttrium composition ratio is 6%, the mobility is low.

The seventh embodiment forms the insulating film 22 primarily containing germanium oxide and yttrium oxide on the germanium substrate 20. This reduces the etching rate by pure water as described in FIG. 16. As described in FIG. 20, inhibited is the deterioration of the interface state between the germanium substrate 20 and the insulating film 22 due to the exposure in the atmosphere. As described in FIG. 21, the interface state density is reduced. As described in FIG. 22, the leakage current is reduced. As described above, the interface state between the germanium substrate 20 and the insulating film 22 is maintained stable, and the mobility is improved as described in FIG. 23A and FIG. 23B.

The reason why yttrium oxide stabilizes the interface state is considered to be because the bond between germanium and oxygen in the insulating film 22 becomes stable as illustrated in FIG. 18A through FIG. 19. As demonstrated by FIG. 16 and FIG. 21 through FIG. 23, the yttrium composition ratio is preferably 6% or greater, more preferably 10% or greater. As described in FIG. 17, to inhibit the deterioration of the RMS, the yttrium composition ratio is preferably 30% or less, more preferably 20% or less.

Eighth Embodiment

An eighth embodiment uses an ScGO film as the insulating film 22. In FIG. 15A, prepared is the single crystal germanium substrate 20 having a (111) plane as a principal plane. The dopant of and the dopant density of the germanium substrate 20 are the same as those of the seventh embodiment. In FIG. 15B, formed as the insulating film 22 is an ScGO film primarily containing germanium oxide and scandium oxide. The ScGO film is formed by co-sputtering germanium oxide and scandium oxide. In FIG. 15C, the heat treatment is conducted under the same condition as that of the seventh embodiment.

Prepared were a sample of which the insulating film 22 is germanium oxide ($GeO_2$), a sample with a yttrium composition ratio of 10% in the seventh embodiment (YGO), and a sample with a scandium composition ratio of 10% (ScGO). The etching rate of each sample by pure water was measured, and each sample was analyzed by TDS.

Figure 24:
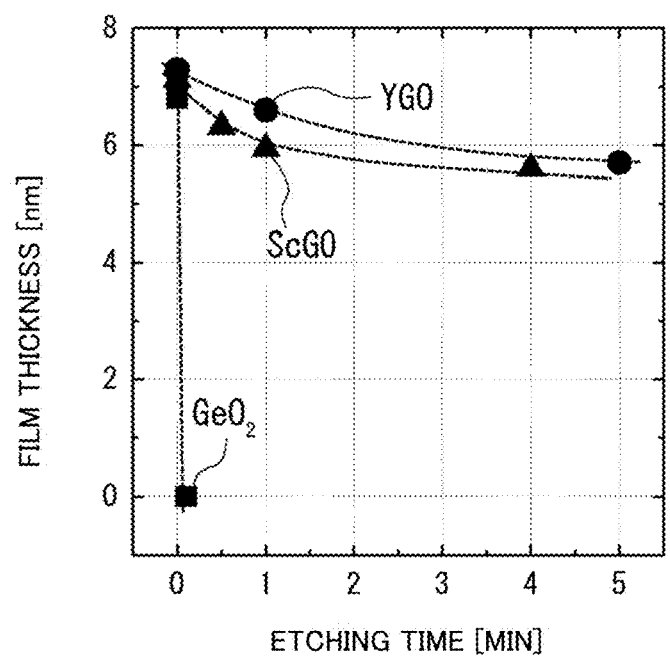
FIG. 24 is a graph of etching time versus the film thickness of an insulating film in an eighth embodiment.

FIG. 24 is a graph of etching time versus the film thickness of the insulating film 22 in the eighth embodiment. Dots are measurement points, and the dashed lines represent approximate lines. As illustrated in FIG. 24, the etching rate of the ScGO film by pure water is less than the etching rate of the germanium oxide film by pure water, but is slightly faster than the etching rate of the YGO film by pure water.

Figure 25:
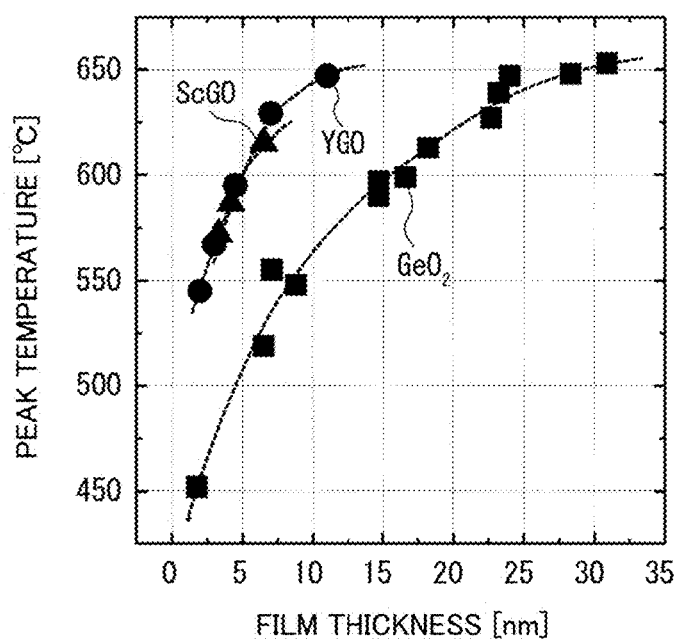
FIG. 25 is a graph of the film thickness of the insulating film versus the peak temperature of TDS in the eighth embodiment.

FIG. 25 is a graph of the film thickness of the insulating film 22 versus the peak temperature of TDS in the eighth embodiment. Dots represent measurement points, and the dashed lines represent approximate lines. As illustrated in FIG. 25, as with the YGO film, the ScGO film has a peak temperature higher than that of the $GeO_2$ film by approximately 100° C.

As described in FIG. 11, scandium oxide has an oxygen potential nearly equal to that of yttrium oxide. Thus, as illustrated in FIG. 24, the etching rate of the ScGO film by pure water is low, similarly to the etching rate of the YGO film by pure water. As illustrated in FIG. 25, the desorbing temperature of germanium monoxide is high. As described above, the use of an ScGO film as the insulating film 22 inhibits the deterioration of the insulating film 22 and/or the deterioration of the interface.

Ninth Embodiment

Figure 26A:
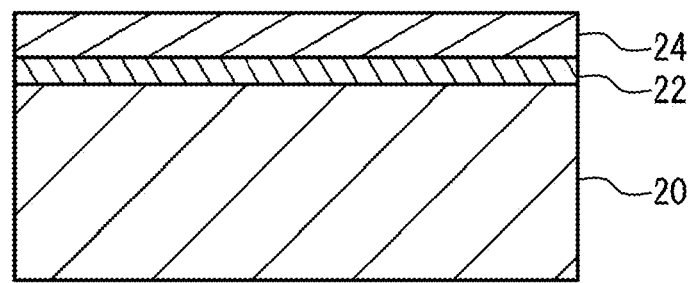
FIG. 26A and FIG. 26B are cross-sectional views illustrating a method of fabricating a semiconductor structure in accordance with a ninth embodiment.
Figure 26B:
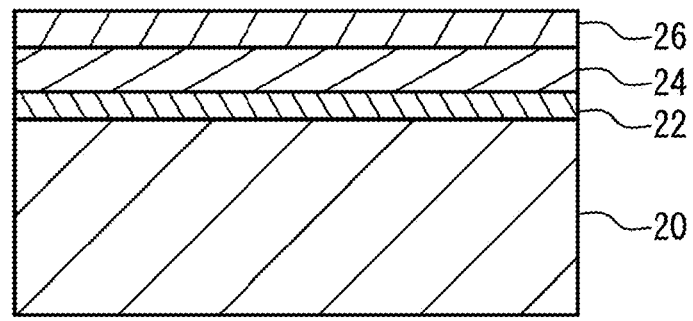

FIG. 26A and FIG. 26B are cross-sectional views illustrating a method of fabricating a semiconductor structure in accordance with a ninth embodiment. As illustrated in FIG. 26A, after the process of FIG. 15B in the seventh embodiment, a hafnium oxide ($HfO_2$) film as the insulating film 24 is formed on the insulating film 22 that is a YGO film with a yttrium composition ratio of 10%. The hafnium oxide film is formed by sputtering. Then, the heat treatment is conducted in a mixed gas atmosphere of a nitrogen gas and an oxygen gas (having an oxygen concentration of 0.1%) for 30 seconds of heat treatment time. As illustrated in FIG. 26B, a gold film as the metal film 26 is formed on the insulating film 24.

Figure 27:
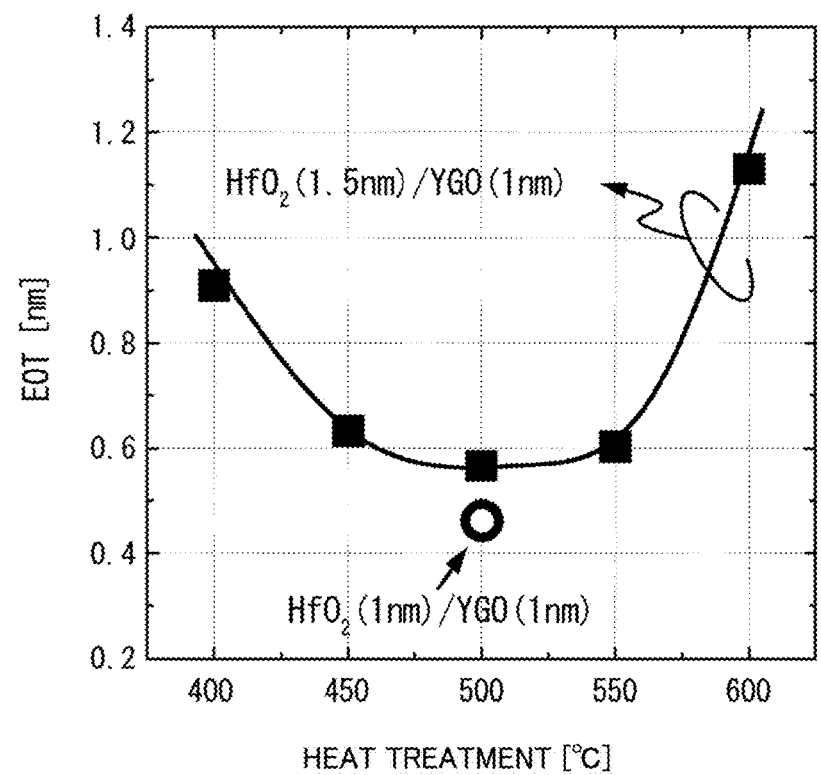
FIG. 27 is a graph of the heat-treatment temperature in the method of fabricating the semiconductor structure of the ninth embodiment versus the EOT of the insulating film.

FIG. 27 is a graph of heat treatment temperature in the method of fabricating the semiconductor structure of the ninth embodiment versus the EOT of the insulating film. Changed was the heat treatment temperature of the heat treatment conducted on the sample of which the YGO film as the insulating film 22 had a film thickness of 1 nm, and of which the hafnium oxide film as the insulating film 24 had a film thickness of 1.5 nm. When the heat treatment temperature is between 450° C. and 550° C., the EOT is approximately 0.6 nm. When the heat treatment temperature is 500° C., the EOT is the thinnest. When the sample of which the YGO film as the insulating film 22 had a film thickness of 1 nm, and of which the hafnium oxide film as the insulating film had a film thickness of 1 nm, was heat treated at a heat treatment temperature of 500° C., the EOT was 0.47 nm.

As described in the ninth embodiment, when the insulating film 24 having a permittivity higher than the permittivity of silicon oxide is formed on the insulating film 22, the EOT is reduced, and the good interface state between the germanium substrate 20 and the insulating film 22 is provided.

Tenth Embodiment

Figure 28A:
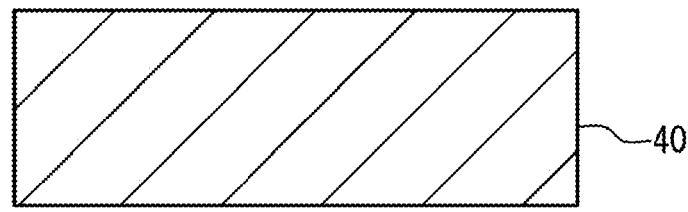
FIG. 28A through FIG. 28D are cross-sectional views illustrating a method of fabricating a semiconductor structure in accordance with a tenth embodiment.

FIG. 28A through FIG. 28D are cross-sectional views illustrating a method of fabricating a semiconductor structure in accordance with a tenth embodiment. As illustrated in FIG. 28A, a germanium layer 40 is prepared. The germanium layer 40 may be a single crystal germanium substrate, or a germanium film formed on a substrate (for example, an insulating substrate such as a silicon substrate or a glass substrate). Alternatively, the germanium layer 40 may be high-purity germanium, or may contain impurities. For example, the germanium layer 40 may be n-type or p-type germanium. Furthermore, the germanium layer 40 may contain silicon as long as the effect of the above experiment is obtained. The composition ratio of silicon is required to be approximately 10 atomic % or less of the total. The germanium layer 40 may have, for example, a (100) plane, a (110) plane, or a (111) plane as a principal plane.

Figure 28B:
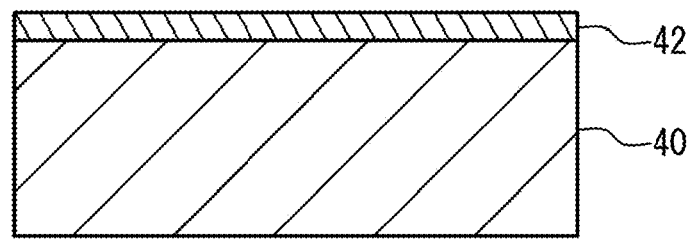

As illustrated in FIG. 28B, an insulating film 42 (a first insulating film) is formed on the upper surface of the germanium layer 40. The insulating film 42 primarily contains germanium dioxide and the oxide of at least one of an alkaline-earth (Group IIA) element and a rare-earth (Group IIIA) element. The alkaline-earth element is beryllium (Be), magnesium (Mg), calcium (Ca), strontium (Sr), barium (Ba), or radium (Ra). The rare-earth element is, for example, scandium, yttrium, or lanthanoid. Lanthanoid is lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), or lutetium (Lu). The insulating film 42 may primarily contain germanium dioxide and aluminum oxide. Alternatively, the insulating film 42 may primarily contain a mixture of the above described oxides and germanium oxide.

The above described oxides have oxygen potentials less than that of germanium oxide. Thus, in the insulating film 42, germanium combines with oxygen more stably. This inhibits the deterioration of the insulating film 42 and/or the deterioration of the interface between the insulating film 42 and the germanium layer 40 due to the fabrication process after the formation of the insulating film 42, or the exposure in the atmosphere.

Since the insulating film 42 is used as a gate insulator, the insulating film 42 preferably has a high permittivity. In addition, the insulating film 42 preferably fails to react with the germanium layer 40 and a metal layer such as the gate electrode. Accordingly, the insulating film 42 preferably primarily contains at least one of germanium oxide, yttrium oxide, scandium oxide, and aluminum oxide.

The insulating film 42 is formed by, for example, sputtering. The insulating film 42 may also be formed by other methods. Since the insulating film 42 is used as a gate insulator in the end, the film thickness of the insulating film 42 is preferably 3 nm or less of physical film thickness, more preferably 2 nm or less After the insulating film 42 is formed, the insulating film 42 may be thinned by etching.

The atomic composition ratio of the oxide of at least one of an alkaline-earth element, a rare-earth element, and aluminum in the insulating film 42 used as a gate insulator is preferably 6% or greater, more preferably 10% or greater, to stabilize the insulating film 42 and the interface between the germanium layer 40 and the insulating film 42. Moreover, the atomic composition ratio is preferably 50 atomic % or less, more preferably 30 atomic % or less. The atomic composition ratio is a ratio of at least one element of an alkaline-earth element, a rare-earth element, and aluminum to the at least one element and germanium.

Figure 28C:
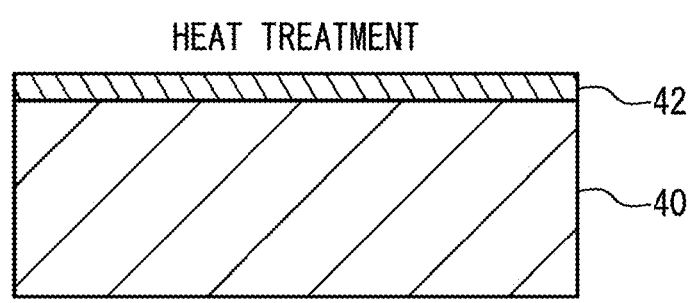

As illustrated in FIG. 28C, the insulating film 42 is heat treated. This process strengthens the bond between atoms in the insulating film 42. The heat treatment may be conducted in an inert gas atmosphere or in an oxidizing gas atmosphere. The inert gas may be a nitrogen gas or a gas of a XVIII-family element, or a mixed gas of them. The oxidizing gas may be, for example, an oxygen gas, or a mixed gas of oxygen and an inert gas. The pressure of the gas atmosphere may be atmospheric pressure (1 atm), greater than 1 atm, or less than 1 atm. When the pressure of the gas atmosphere is 1 atm, the heat treatment device is simplified. The heat treatment temperature is preferably 400° C. or greater and 600° C. or less, more preferably 450° C. or greater and 550° C. or less. The heat treatment may serve as the heat treatment for activating ion-implanted dopant.

Figure 28D:
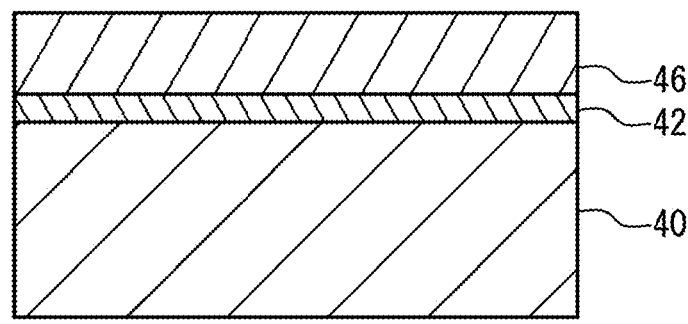

As illustrated in FIG. 28D, a gate electrode 46 is formed on the insulating film 42. The gate electrode 46 is a conductive material such as gold, copper, or aluminum.

Eleventh Embodiment

Figure 29A:
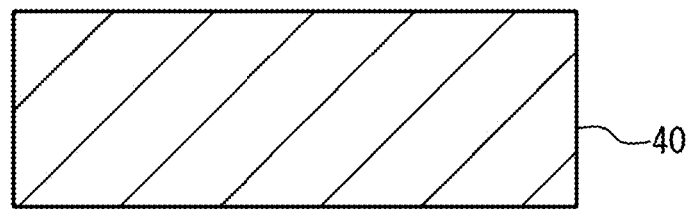
FIG. 29A through FIG. 29D are cross-sectional views illustrating a method of fabricating a semiconductor structure in accordance with an eleventh embodiment.
Figure 29B:
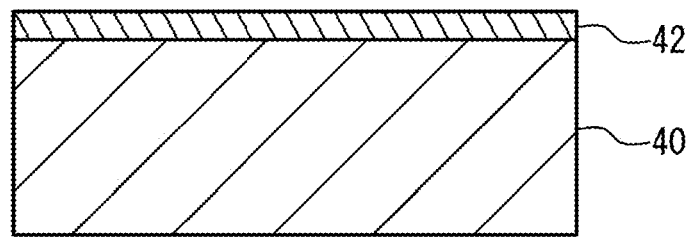

FIG. 29A through FIG. 29D are cross-sectional views illustrating a method of fabricating a semiconductor structure in accordance with an eleventh embodiment. As illustrated in FIG. 29A, the germanium layer 40 is prepared as in the tenth embodiment. As illustrated in FIG. 29B, the insulating film 42 is formed on the germanium layer 40. The insulating film 42 is the same as that of the tenth embodiment. The insulating film 42 is formed by, for example, sputtering. Since the insulating film 42 is used as a gate insulator, the film thickness of the insulating film 42 is preferably 3 nm or less of physical film thickness, more preferably 2 nm or less.

Figure 29C:
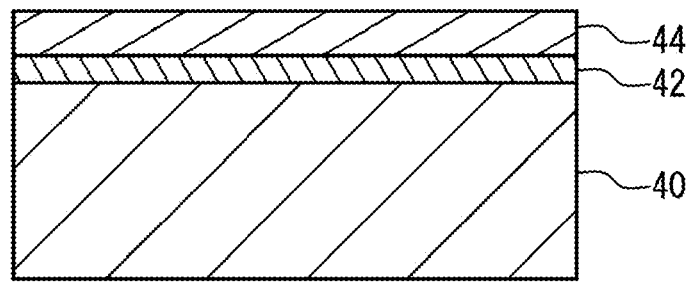

As illustrated in FIG. 29C, an insulating film 44 (a second insulating film) that has a composition different from the composition of the insulating film 42 is formed on the insulating film 42. The insulating film 44 is, for example, a high permittivity (High-k) insulating film, and preferably has a permittivity greater than the permittivity of, for example, silicon oxide. The insulating film 44 may be at least one of, for example, an aluminum nitride film, a hafnium oxide film, a zirconium oxide film, a titanium oxide film, an aluminum oxide film, a yttrium oxide film, and an oxide film of a rare-earth element (for example, a lanthanum oxide film).

Figure 29D:
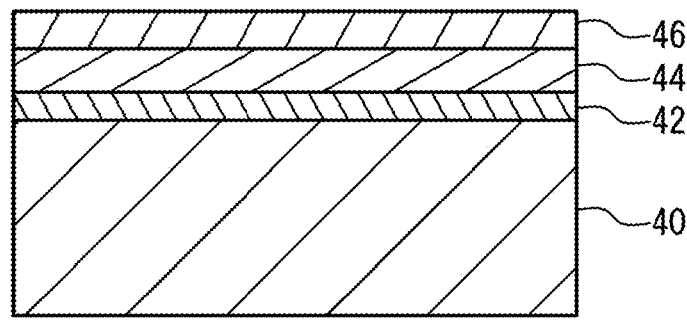

As illustrated in FIG. 29D, after the insulating film 44 is formed, the germanium layer 40, the insulating film 42, and the insulating film 44 are heat treated at a heat treatment temperature higher than the temperature at which the insulating film 42 and the insulating film 44 are formed. The heat treatment condition is the same as, for example, the heat treatment condition of FIG. 28C of the tenth embodiment. The gate electrode 46 is formed on the insulating film 44. The gate electrode 46 is the same as the gate electrode of, for example, FIG. 28D of the tenth embodiment.

The insulating film 42 may be formed by diffusion of the element of the insulating film 44 into the native germanium oxide film formed on the germanium layer 40. For example, the insulating film 42 is not formed in FIG. 29B, and the insulating film 44 (for example, a yttrium oxide film) is formed on the germanium layer 40 in FIG. 29C. The heat treatment in FIG. 29D causes the element (for example, yttrium) in the insulating film 44 to diffuse into the native germanium oxide film between the germanium layer 40 and the insulating film 44 to form the insulating film 42 (germanium oxide containing yttrium oxide).

When the element of the insulating film 44 is diffused into the native germanium oxide film to form the insulating film 42, the control of the film thickness and the composition of the insulating film 42 is difficult. In addition, a relatively thick insulating film 42 cannot be formed. In contrast, the method that forms the insulating film 44 after the formation of the insulating film 42 enables to control the film thickness and the composition of the insulating film 42.

As described in the tenth embodiment, the gate electrode 46 may be formed on the insulating film 42 without forming the insulating film 44 that is a high permittivity insulating film. As described in the eleventh embodiment, the insulating film 44 is formed on the insulating film 42, and the gate electrode 46 may be formed on the insulating film 44. The tenth and eleventh embodiments inhibit the deterioration of the insulating film 42 and the deterioration of the interface between the insulating film 42 and the germanium layer 40.

The semiconductor structure according to any one of the tenth and eleventh embodiments may be applied to the same MOSFET as that of the sixth embodiment. The semiconductor structure according to any one of the tenth and eleventh embodiments may be applied to semiconductor devices other than a MOSFET.

Twelfth Embodiment

A twelfth embodiment uses the insulating film 22 (an MGO film) containing germanium oxide and a trivalent metal (Trivalent metal) M. The oxide of the trivalent metal M is an oxide having the chemical formula of $M_2O_3$. In FIG. 15A through FIG. 15C of the seventh and eighth embodiments, as the insulating film 22, an AlGO film and an LaGO film are formed in addition to the YGO film and the ScGO film. The AlGO film is a film primarily containing germanium oxide and aluminum oxide ($Al_2O_3$). The LaGO film is a film primarily containing germanium oxide and lanthanum oxide ($La_2O_3$). The MGO film is formed by sputtering using targets of germanium oxide ($GeO_2$) and M oxide ($M_2O_3$) and using an argon gas. The concentration of M to M and Ge in the insulating film 22 was made to be approximately 10%.

Figure 30:
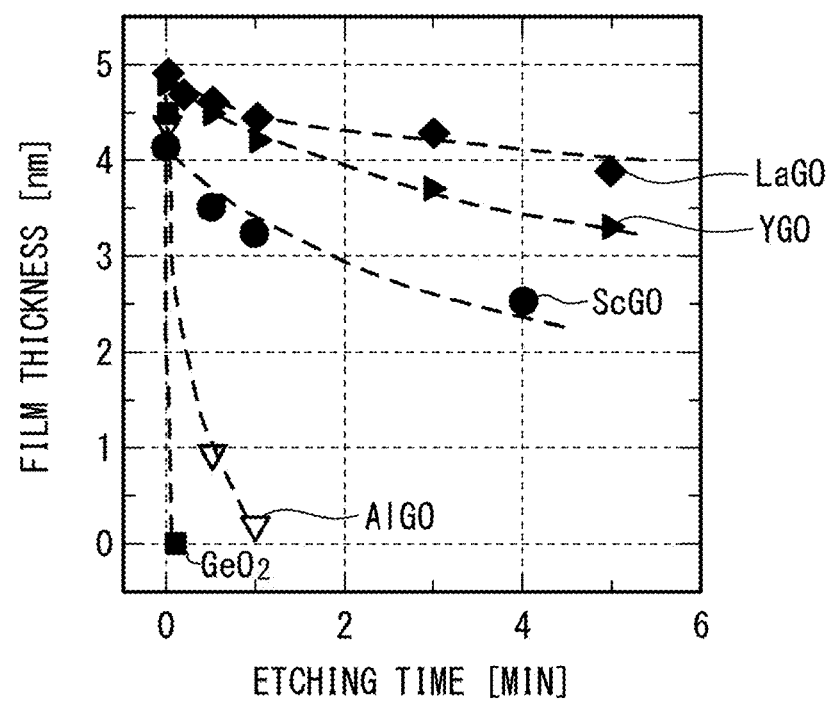
FIG. 30 is a graph of etching time versus the film thickness of an insulating film in a twelfth embodiment.

FIG. 30 is a graph of etching time versus the film thickness of the insulating film 22 in the twelfth embodiment. Dots represent measurement points, and the dashed lines represent approximate lines. The measurement method is the same as that of FIG. 16 and FIG. 24, and thus the description is omitted. As illustrated in FIG. 30, the etching rate of the MGO film by pure water is less than the etching rate of the $GeO_2$ film by pure water. The etching rate of the LaGO film is the lowest, and the etching rate increases in the order of the YGO film, the ScGO film, and the AlGO film.

Figure 31:
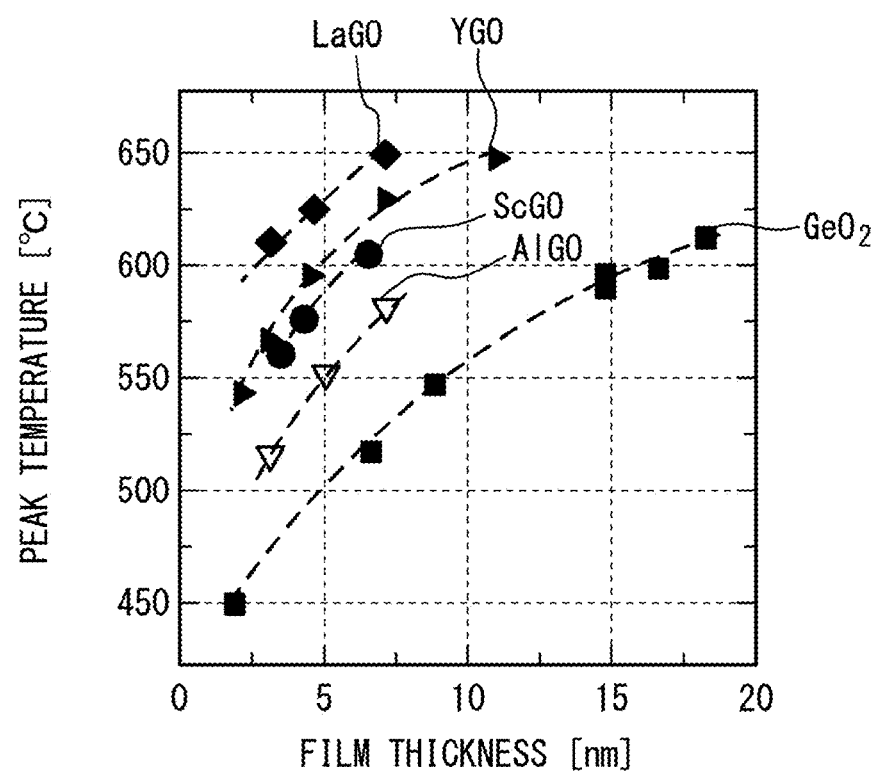
FIG. 31 is a graph of the film thickness of the insulating film 2 versus the peak temperature of TDS in the twelfth embodiment.

FIG. 31 is a graph of the film thickness of the insulating film versus the peak temperature of TDS in the twelfth embodiment. Dots represent measurement points, and the dashed lines represent approximate lines. The measurement method is the same as that of FIG. 6A and FIG. 25, and thus the description is omitted. As illustrated in FIG. 31, the peak temperature at which GeO desorbs from the insulating film 22 is higher than the peak temperature at which Geo desorbs from the $GeO_2$ film. The LaGO film has the highest peak temperature, and the peak temperature decreases in the order of the YGO film, the ScGO film, and the AlGO film.

As described above, when the insulating film 22 contains the oxide $M_2O_3$ of the trivalent metal M in addition to germanium oxide, the etching rate by pure water decreases, and the desorbing temperature of GeO increases. This is considered to be because $M_2O_3$ has an oxygen potential lower than that of $GeO_2$ as illustrated in FIG. 11.

Figure 32A:
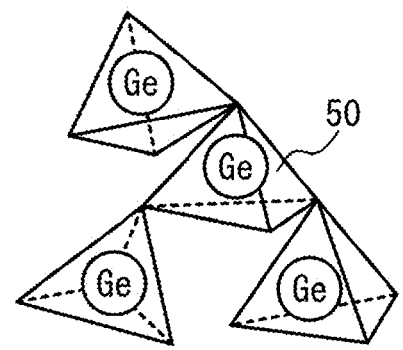
FIG. 32A through FIG. 32C are schematic views of networks in the insulating film 22.
Figure 32B:
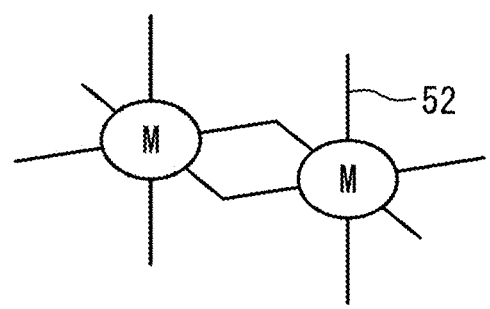
Figure 32C:
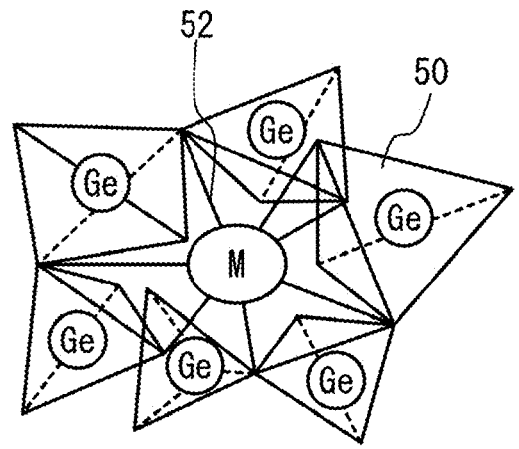

Furthermore, a model in which the network in the germanium oxide film is modified by the inclusion of the oxide $M_2O_3$ (Network modification model) was considered. FIG. 32A through FIG. 32C are schematic views of networks in the insulating film 22. As illustrated in FIG. 32A, the network in $GeO_2$ has a structure where O atoms are located at vertices of a tetrahedron 50 centered at a Ge atom. As illustrated in FIG. 32B, the oxide $M_2O_3$ has a structure where an M atom and an O atom are combined by an M-O bond 52. As illustrated in FIG. 32C, when the oxide $M_2O_3$ is added to germanium oxide $GeO_2$, the M-O bond 52 is added. This modifies the network of germanium oxide $GeO_2$. It is considered that the M-O bond 52 enhances the binding strength of the network. This is considered to stabilize the interface state between germanium and the MO film also in the MGO film as discussed for the YGO film in the seventh embodiment.

As described above, when the insulating film contains germanium oxide $GeO_2$ and the oxide $M_2O_3$ of the trivalent metal M, the interface state is stabilized. The trivalent metal M may be at least one of an alkaline-earth element, a rare-earth element, and aluminum, or a mixture of at least two of them.

According to the above-described network modification model, it is considered that the trivalent metal other than yttrium has a relationship between M concentration and Dit that does not greatly differ from the relationship illustrated in FIG. 21. Therefore, the atomic composition ratio of the trivalent metal M to the trivalent metal M and germanium Ge in the insulating film 22 is preferably 6% or greater, more preferably 10% or greater, further preferably 15% or greater. Additionally, it is considered that the trivalent metal M other than yttrium also has a relationship between the M concentration and the relative permittivity that does not greatly differ from the relationship illustrated in FIG. 17. Thus, the atomic composition ratio of the trivalent metal M to the trivalent metal M and germanium Ge in the insulating film 22 is preferably 30% or less, more preferably 20% or less.

Figure 33:
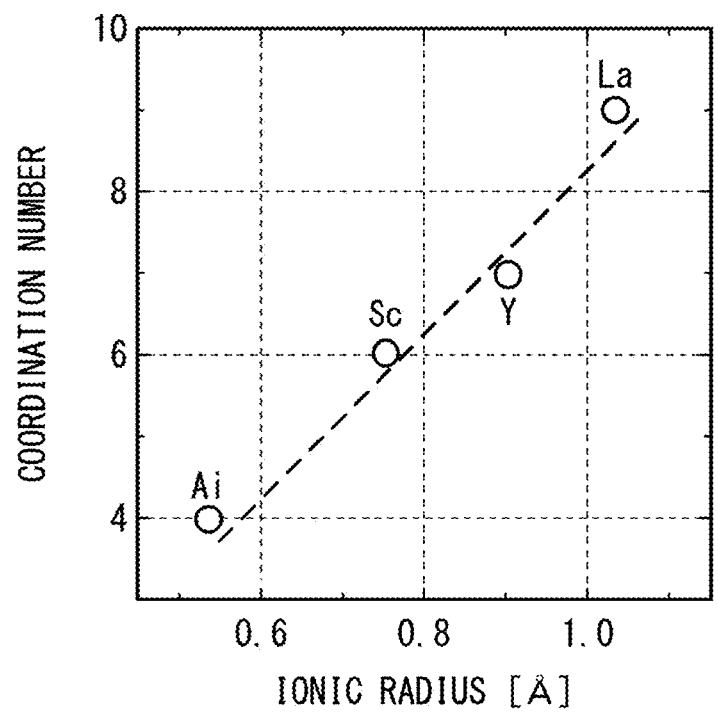
FIG. 33 is a graph of ionic radius versus coordination number.

The preferable metal of the trivalent metal M is considered. It has been known that the chemical properties of the trivalent metal M greatly depend on an ionic radius. FIG. 33 is a graph of ionic radius versus coordination number. Aluminum, scandium, yttrium, and lanthanum are presented. As illustrated in FIG. 33, as the ionic radius increases, the coordination number increases.

Figure 34:
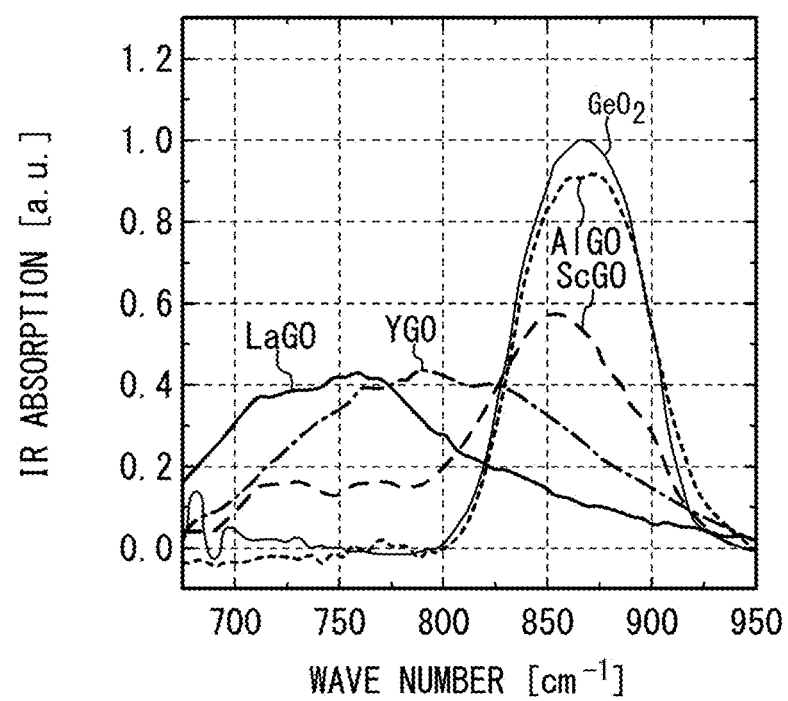
FIG. 34 is a graph of wave number versus the infrared absorption of the insulating film 22 in the twelfth embodiment.

FIG. 34 is a graph of wave number versus the infrared absorption of the insulating film 22 in the twelfth embodiment. The measurement method is the same as that of FIG. 19, and the description is omitted. As illustrated in FIG. 34, the peak wave number of and the intensity of the AlGO film are almost the same as those of the $GeO_2$ film. The peak wave number shifts from the $GeO_2$ film in the order of the ScGO film, the YGO film, and the LaGO film, and the peak is broadened. As illustrated, as the ionic radius of the trivalent metal M increases, the network structure of the bond in the insulating film 22 greatly changes.

From FIG. 33 and FIG. 34, it may be considered that the large ionic radius is preferable because the large ionic radius allows the structure to be modified to the network structure illustrated in FIG. 32C and strengthens the bond. However, the experiment by the inventors reveals that the interface state is not good in the LaGO film.

Figure 35A:
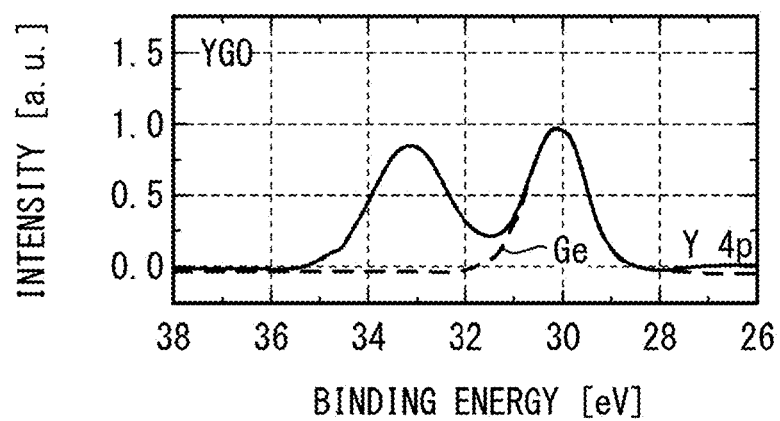
FIG. 35A and FIG. 35B are graphs of the binding energy of $Ge^{4+}3d$ versus XPS intensity.
Figure 35B:
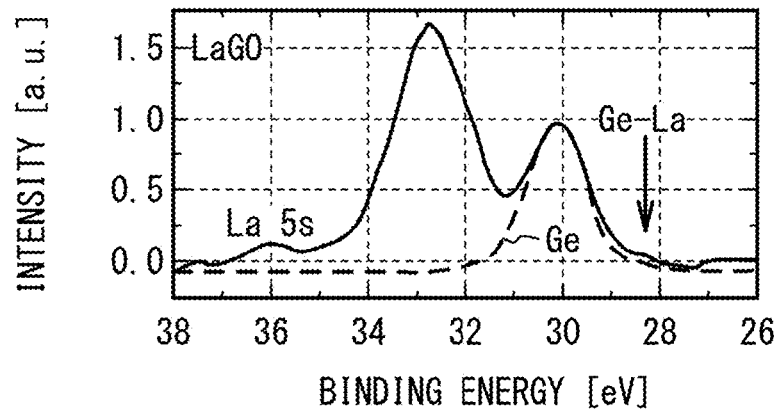

A YGO film and an LaGO film formed on the germanium substrate were analyzed by XPS. FIG. 35A and FIG. 35B are graphs of the binding energy of $Ge^{4+}3d$ versus XPS intensity. The dashed line represents the wave form of the germanium substrate. The peak near 30 eV is the peak of a Ge—Ge bond. The peak near 33 eV is the peak of a bond between Y—$GeO_2$ and La—$GeO_2$. The peak of Y4p is observed in the YGO film, and the peak of La5s is observed in the ScGO film. The peak of a Ge—Y bond is not observed in the YGO film, whereas the peak of a Ge—La bond is observed in the LaGO film. This reveals that the Ge—La bond is formed in the LaGO film.

Figure 36:
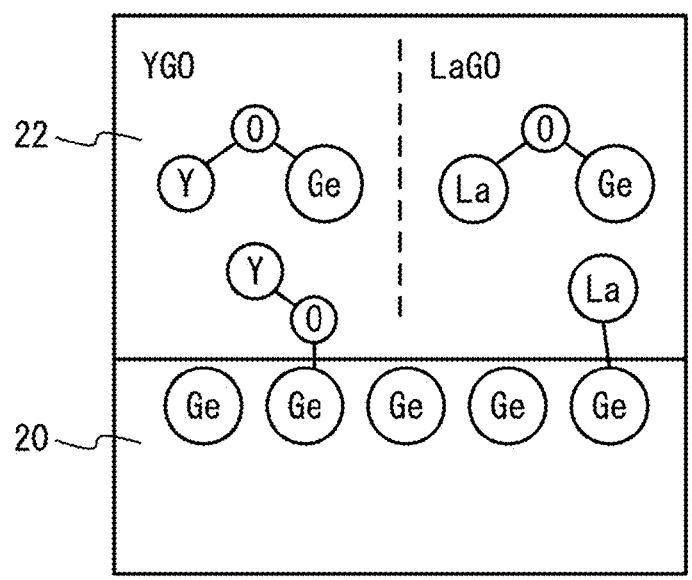
FIG. 36 is a schematic view illustrating a binding state in the insulating film 22.

FIG. 36 is a schematic view illustrating a binding state in the insulating film 22. The insulating film 22 is formed on the germanium substrate 20. As the insulating film 22, the LaGO film is presented at the right side, and the YGO film is presented at the left side. A Y—O—Ge bond is formed in the YGO film, and a La—O—Ge bond is formed in the LaGO film. At the interface between the germanium substrate 20 and the insulating film 22, Y combines with Ge through O in the YGO film, whereas La directly combines with Ge in the LaGO film. As described above, when the ionic radius of M is too large, a direct bond between Ge and M is generated. This is considered to deteriorate the interface state.

Figure 37:
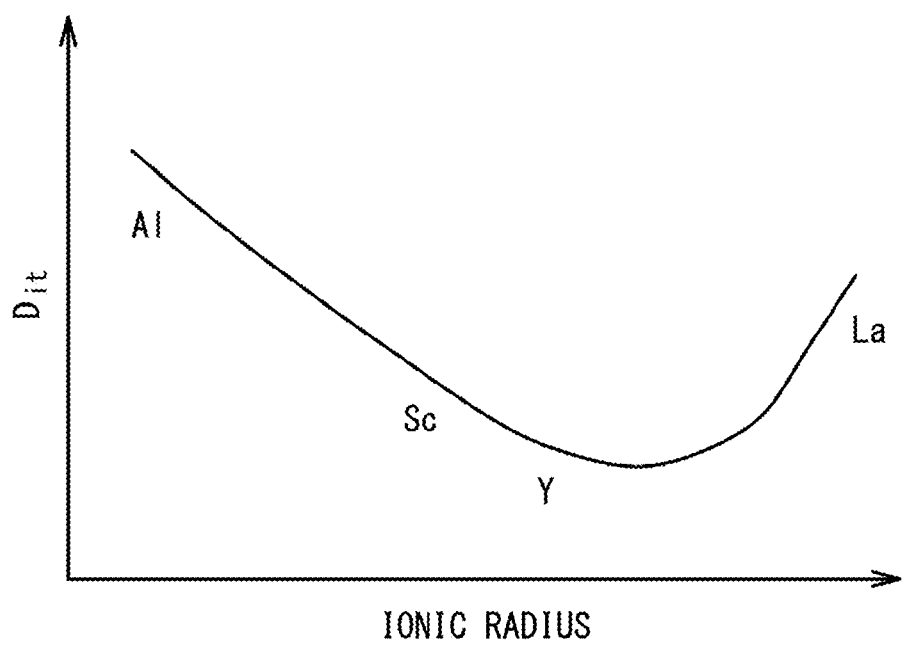
FIG. 37 is a schematic view illustrating ionic radius versus Dit.

FIG. 37 is a schematic view illustrating ionic radius versus Dit. FIG. 37 schematically illustrates the relationship between ionic radius and Dit based on the experiment by the inventors. Like aluminum, when the ionic radius is small, the Dit of the MGO film is large. When the ionic radius is approximately the same as that of yttrium or scandium, the Dit of the MGO film is the smallest. Like lanthanum, when the ionic radius is large, the Dit of the MGO film is large. As described above, it is considered that the ionic radius of M that improves the interface state exists.

From FIG. 33 through FIG. 37, the ionic radius of the trivalent metal is preferably 0.7 Å or greater and 1.0 Å or less. The trivalent metals having an ionic radius within the above range are gadolinium, terbium, dysprosium, holmium, erbium, thulium, ytterbium, and lutetium in addition to yttrium and scandium. As described above, an oxide contained in the insulating film 22 is preferably the oxide of at least one of yttrium, scandium, gadolinium, terbium, dysprosium, holmium, erbium, thulium, ytterbium, and lutetium, or a mixture of oxides of at least two of them. Furthermore, the ionic radius of the trivalent metal is preferably 0.75 Å or greater and 0.95 Å or less.

The insulating film 22 of the twelfth embodiment may be used in the tenth and eleventh embodiments. Also, the insulating film 22 of the twelfth embodiment may be applied to the same MOSFET as the MOSFET of the sixth embodiment. Furthermore, the insulating film 22 of the twelfth embodiment may be applied to semiconductor devices other than a MOSFET.

Although preferred embodiments of the present invention have been described so far, the present invention is not limited to those particular embodiments, and various changes and modifications may be made to them within the scope of the invention claimed herein.

DESCRIPTION OF REFERENCE NUMERALS 10, 20 germanium substrate
12, 22 insulating film
16, 26 metal film
30, 40 germanium layer
32, 34, 42, 44 insulating film
35 gate insulator
36, 46 gate electrode
38 source or drain region

The invention claimed is:
1. A semiconductor structure comprising:
a germanium layer; and
a first insulating film that is formed on an upper surface of the germanium layer, primarily contains germanium oxide and a substance having an oxygen potential lower than an oxygen potential of germanium oxide, and has a physical film thickness of 3 nm or less;
wherein a half width of frequency to height in a 1 μm square area of the upper surface of the germanium layer is 0.7 nm or less.
2. The semiconductor structure according to claim 1, wherein:
the substance primarily contains at least one element of yttrium oxide, scandium oxide, and aluminum oxide; and
an atomic composition ratio of the at least one element of yttrium, scandium, and aluminum to the at least one element and germanium in the first insulating film is 10% or greater and 30% or less.
3. The semiconductor structure according to claim 1, further comprising:
a metal layer formed on the first insulating film.
4. The semiconductor structure according to claim 1, further comprising:
a second insulating film that is formed on the first insulating film and has a composition different from a composition of the first insulating film; and
a metal layer formed on the second insulating film.
5. The semiconductor structure according to claim 1, wherein
the half width is 0.5 nm or less.
6. A semiconductor structure comprising:
a germanium layer; and
a first insulating film that is formed on an upper surface of the germanium layer, is made of a composite of germanium oxide and an oxide of at least one element of an alkaline-earth element, a rare-earth element, and aluminum, and has a physical film thickness of 3 nm or less;
wherein an atomic composition ratio of the at least one element of an alkaline-earth element, a rare-earth element, and aluminum to a total of the at least one element and germanium in the first insulating film is 10% or greater and 30% or less at an interface between the first insulating film and the germanium layer.
7. The semiconductor structure according to claim 6, wherein
the at least one element of an alkaline-earth element, a rare-earth element, and aluminum is at least one of yttrium, scandium, gadolinium, terbium, dysprosium, holmium, erbium, thulium, ytterbium, and lutetium.
8. The semiconductor structure according to claim 6, further comprising:
a second insulating film that is formed on the first insulating film and has a permittivity greater than a permittivity of silicon oxide; and
a gate electrode formed on the second insulating film;
wherein the first insulating film is sandwiched between the germanium layer and the second insulating film, and the second insulating film is sandwiched between the first insulating film and the gate electrode.

9. The semiconductor structure according to claim 6, further comprising:
a gate electrode formed on the first insulating film without a second insulating film having a permittivity greater than a permittivity of silicon oxide;
wherein the first insulating film is sandwiched between the germanium layer and the gate electrode.

10. The semiconductor structure according to claim 6, wherein
the first insulating film contains germanium oxynitride.

11. The semiconductor structure according to claim 6, wherein
the first insulating film is made of a composite of germanium oxide and at least one of yttrium oxide and scandium oxide.

12. The semiconductor structure according to claim 6, wherein
the first insulating film is made of a composite of germanium oxide and yttrium oxide.

13. A semiconductor structure comprising:
a germanium layer; and
a first insulating film that is formed on an upper surface of the germanium layer, is made of a composite of germanium oxide and an oxide of at least one element of yttrium and scandium, and has a physical film thickness of 3 nm or less;
wherein an atomic composition ratio of the at least one element of yttrium and scandium to a total of the at least one element and germanium in the first insulating film is 6% or greater and 30% or less at an interface between the first insulating film and the germanium layer.

* * * * *